US008901676B2

(12) United States Patent
Abou-Khalil et al.

(10) Patent No.: US 8,901,676 B2
(45) Date of Patent: Dec. 2, 2014

(54) LATERAL EXTENDED DRAIN METAL OXIDE SEMICONDUCTOR FIELD EFFECT TRANSISTOR (LEDMOSFET) HAVING A HIGH DRAIN-TO-BODY BREAKDOWN VOLTAGE (VB), A METHOD OF FORMING AN LEDMOSFET, AND A SILICON-CONTROLLED RECTIFIER (SCR) INCORPORATING A COMPLEMENTARY PAIR OF LEDMOSFETS

(75) Inventors: Michel J. Abou-Khalil, Essex Junction, VT (US); Alan B. Botula, Essex Junction, VT (US); Alvin J. Joseph, Williston, VT (US); Theodore J. Letavic, Putnam Valley, NY (US); James A. Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 456 days.

(21) Appl. No.: 13/238,414

(22) Filed: Sep. 21, 2011

(65) Prior Publication Data
US 2012/0168817 A1    Jul. 5, 2012

Related U.S. Application Data

(63) Continuation-in-part of application No. 12/983,439, filed on Jan. 3, 2011, now Pat. No. 8,299,547.

(51) Int. Cl.
*H01L 29/78* (2006.01)
*H01L 29/41* (2006.01)
*H01L 29/40* (2006.01)
*H01L 29/423* (2006.01)
*H01L 29/66* (2006.01)
*H01L 29/74* (2006.01)

(52) U.S. Cl.
CPC ...... *H01L 29/66681* (2013.01); *H01L 29/7824* (2013.01); *H01L 29/402* (2013.01); *H01L 29/7825* (2013.01); *H01L 29/407* (2013.01); *H01L 29/4238* (2013.01); *H01L 29/7436* (2013.01); *H01L 29/785* (2013.01); *H01L 29/66795* (2013.01); *H01L 29/66704* (2013.01)
USPC ........................................................ 257/409

(58) Field of Classification Search
CPC ............ H01L 29/1095; H01L 29/0696; H01L 29/7816; H01L 29/7801; H01L 29/66681; H01L 29/7824; H01L 29/66674; H01L 29/402; H01L 29/407; H01L 29/404; H01L 29/7825; H01L 29/66704
USPC .................. 257/328, 335, 343, 409, E29.256, 257/E29.261
See application file for complete search history.

(56) References Cited

U.S. PATENT DOCUMENTS

| 5,907,177 A | 5/1999 | Uda et al. |
| 5,907,181 A | 5/1999 | Han et al. |

(Continued)

FOREIGN PATENT DOCUMENTS

WO    WO2009050669    4/2009

OTHER PUBLICATIONS

Heringa et al., "Innovative lateral field plates by gate fingers on STI regions in deep submicron CMOS," Proceedings of the 20th International Symposium on Power Semiconductor Devices & IC's IEEE, May 2008, pp. 271-274.

(Continued)

*Primary Examiner* — Michele Fan
(74) *Attorney, Agent, or Firm* — Gibb & Riley, LLC; Michael J. LeStrange, Esq.

(57) ABSTRACT

Disclosed are embodiments of a lateral, extended drain, metal oxide semiconductor, field effect transistor (LEDMOSFET) having a high drain-to-body breakdown voltage. Discrete conductive field (CF) plates are adjacent to opposing sides of the drain drift region, each having an angled sidewall such that the area between the drain drift region and the CF plate has a continuously increasing width along the length of the drain drift region from the channel region to the drain region. The CF plates can comprise polysilicon or metal structures or dopant implant regions within the same semiconductor body as the drain drift region. The areas between the CF plates and the drain drift region can comprise tapered dielectric regions or, alternatively, tapered depletion regions within the same semiconductor body as the drain drift region. Also disclosed are embodiments of a method for forming an LEDMOSFET and embodiments of a silicon-controlled rectifier (SCR) incorporating such LEDMOSFETs.

20 Claims, 25 Drawing Sheets

(56) References Cited

U.S. PATENT DOCUMENTS

| | | | |
|---|---|---|---|
| 6,023,090 | A | 2/2000 | Letavic et al. |
| 6,046,474 | A | 4/2000 | Oh et al. |
| 6,414,365 | B1 | 7/2002 | Letavic et al. |
| 6,515,336 | B1 | 2/2003 | Suzawa et al. |
| 6,534,367 | B2 | 3/2003 | Peake et al. |
| 6,617,656 | B2 | 9/2003 | Lee et al. |
| 6,646,287 | B1 | 11/2003 | Ono et al. |
| 6,717,214 | B2 | 4/2004 | Pettruzello et al. |
| 6,833,726 | B2 | 12/2004 | Petruzzello et al. |
| 7,663,237 | B2 | 2/2010 | Peng et al. |
| 7,736,956 | B2 | 6/2010 | Datta et al. |
| 7,777,278 | B2 | 8/2010 | Hirler et al. |
| 7,808,050 | B2 | 10/2010 | Sonsky et al. |
| 7,888,732 | B2 | 2/2011 | Denison et al. |
| 7,897,478 | B2 | 3/2011 | Sonsky |
| 8,299,547 | B2 | 10/2012 | Abou-Khalil et al. |
| 2001/0000033 | A1 | 3/2001 | Baliga |
| 2004/0232486 | A1 | 11/2004 | Disney et al. |
| 2005/0082591 | A1* | 4/2005 | Hirler et al. .................... 257/302 |
| 2006/0006386 | A1 | 1/2006 | Hirler et al. |
| 2007/0052060 | A1* | 3/2007 | Yang ............................ 257/508 |
| 2007/0120187 | A1 | 5/2007 | Udrea et al. |
| 2008/0128743 | A1 | 6/2008 | Letavic et al. |
| 2008/0179672 | A1 | 7/2008 | Hirler et al. |
| 2008/0272428 | A1 | 11/2008 | Letavic et al. |
| 2009/0072319 | A1 | 3/2009 | Sonsky et al. |
| 2009/0256212 | A1* | 10/2009 | Denison et al. ............... 257/408 |
| 2010/0213517 | A1 | 8/2010 | Sonsky et al. |
| 2011/0127602 | A1 | 6/2011 | Mallikarjunaswamy |
| 2011/0147844 | A1 | 6/2011 | Smith |
| 2011/0169103 | A1 | 7/2011 | Darwish et al. |
| 2011/0198691 | A1 | 8/2011 | Sonsky et al. |

OTHER PUBLICATIONS

Abou-Khalil et al., U.S. Appl. No. 12/983,439, filed Jan. 3, 2011, 53 pages.

U.S. Appl. No. 12/983,439, Notice of Allowance Communication, Jul. 19, 2012, 9 pages.

U.S. Appl. No. 13/604,671, Notice of Allowance dated Feb. 26, 2013, 17 pages.

U.S. Appl. No. 13/762,450, Office Action Communication dated Feb. 14, 2014, 10 pages.

U.S. Appl. No. 12/983,439, filed Jan. 3, 2011, Office Action Communication, Nov. 29, 2011, 6 pages.

U.S. Appl. No. 12/983,439, filed Jan. 3, 2011, Office Action Communication, Feb. 10, 2012, 14 pages.

U.S. Appl. No. 13/762,450, Office Action Communication dated Jun. 17, 2014, 10 pages.

Appendix P, "List of IBM Patents or Patent Applications Treated as Related", Jun. 20, 2014, 1 page.

* cited by examiner 100.1 (B-B')

100.1 (C-C')

800.1 and 800.2 (C-C')

LATERAL EXTENDED DRAIN METAL OXIDE SEMICONDUCTOR FIELD EFFECT TRANSISTOR (LEDMOSFET) HAVING A HIGH DRAIN-TO-BODY BREAKDOWN VOLTAGE (VB), A METHOD OF FORMING AN LEDMOSFET, AND A SILICON-CONTROLLED RECTIFIER (SCR) INCORPORATING A COMPLEMENTARY PAIR OF LEDMOSFETS

CROSS-REFERENCE TO RELATED APPLICATIONS

This application is a Continuation-In-Part of U.S. Pat. No. 8,482,067, issued on Jul. 9, 2013, the complete disclosure of which, in its entirety, is herein incorporated by reference.

BACKGROUND

1. Field of the Invention

The embodiments disclosed herein relate generally to lateral, extended drain, metal oxide semiconductor, field effect transistors (LEDMOSFETs) and, more specifically, to embodiments of an LEDMOSFET having a relatively high drain-to-body breakdown voltage (Vb), a method of forming an LEDMOSFET and a silicon-controlled rectifier (SCR) incorporating a complementary pair of LEDMOSFETs.

2. Description of the Related Art

Generally, integrated circuit structures are designed with the following goals in mind: (1) decreasing device size; (2) increasing device performance (e.g., by increasing switching speed); and, (3) decreasing power consumption. Device size scaling can lead to a corresponding decrease in device channel lengths and, thereby can lead to a corresponding increase in switching speed. However, device size scaling has its limits because the resulting short channel lengths can lead to a number of undesirable "short-channel effects". These short-channel effects include, but are not limited, a reduction in threshold voltage (Vt), an increase in drain leakage current, punch through (i.e., diffusion of dopants from the source and drain into the channel), and drain induced barrier lowering (DIBL).

To overcome or at least reduce such short-channel effects, halos can be incorporated into field effect transistor structures. Specifically, halos are highly doped regions, which have the same conductivity type as the field effect transistor body and which are positioned on each side of the channel (i.e., on the source-side and the drain-side of the channel) at the interfaces with the source and drain, respectively. These halos reduce the presence of short channel effects (e.g., increase threshold voltage (Vt), reduce punch through, etc.) and the effectiveness of the halos is dependent upon the location, concentration, and confinement of the halo dopant. Unfortunately, halos with a relatively high dopant concentration can also cause a corresponding decrease in switching speed.

Consequently, field effect transistor structures have been developed that balance the need to reduce the short channel effects exhibited by a scaled device with the need for a faster switching speed. For example, one such field effect transistor structure is a lateral, extended drain, metal oxide semiconductor, field effect transistor (LEDMOSFET) that is asymmetric with respect to the source/drain drift region configuration (e.g., the drain drift region can be longer than the source drift region, if any, and can have a lower dopant concentration). Those skilled in the art will recognize that the source/drain drift regions are also often referred to source/drain extension regions. Optionally, an LEDMOSFET can also be asymmetric with respect to the halo configuration (e.g., a source-side halo only). Such an LEDMOSFET provides decreased source resistance, increased threshold voltage, decreased off current (Ioff), increased leakage at the source-to-body junction, decreased leakage at the drain-to-body junction, decreased drain-to-body capacitance and decreased drain-to-body capacitance and, thereby limits short channel effects without decreasing switching speed. Typically such transistors have a drain-to-body breakdown voltage (Vb) of 10-15 volts, making them suitable for use in many applications. However, there are applications that require transistors with higher drain-to-body breakdown voltages. For example, for switch applications, a Vb of greater than 20 volts may be required and, for micro-electronic mechanical (MEMS) applications, a Vb of 30-50 volts may be required.

SUMMARY

In view of the foregoing, related U.S. application Ser. No. 12/983,439 disclosed embodiments of a lateral, extended drain, metal oxide semiconductor, field effect transistor (LEDMOSFET) having tapered dielectric field plates between the LEDMOSFET drain drift region and gate structure extensions that function as conductive field plates in order to achieve a relatively high drain-to-body breakdown voltage (Vb); embodiments of an associated method for forming the LEDMOSFETs; and embodiments of a program storage device for designing the LEDMOSFETs.

Newly disclosed herein are additional embodiments of a lateral, extended drain, metal oxide semiconductor, field effect transistor (LEDMOSFET) having a relatively high drain-to-body breakdown voltage (Vb). In these newly disclosed embodiments, rather than being gate structure extensions, the conductive field plates can be discrete, independently biasable, conductive structures that are isolated from the gate structure. For example, the conductive field plates can comprise discrete polysilicon or metal structures. Alternatively, the conductive field plates can comprise dopant implant regions within the same semiconductor body as the drain drift region. Furthermore, rather than being tapered dielectric regions, the areas between the conductive field plates and the drain drift region can comprise tapered depletion regions in the same semiconductor body as the drain drift region. Also newly disclosed herein are embodiments of a method for forming such an LEDMOSFET and embodiments of a silicon-controlled rectifier (SCR) incorporating a complementary pair of such LEDMOSFETs.

More particularly, disclosed herein are embodiments of a field effect transistor and, particularly, a lateral, extended drain, metal oxide semiconductor, field effect transistor (LEDMOSFET) having a relatively high drain-to-body breakdown voltage (Vb). The LEDMOSFET can comprise a semiconductor body comprising a channel region, a drain region, and a drain drift region between the channel region and the drain region. The LEDMOSFET can further comprise conductive field plates adjacent to opposing sides of the drain drift region. Each conductive field plate can have a sidewall that is angled relative to the drain drift region such that the area between the drain drift region and the conductive field plate has a continuously increasing width along a length of the drain drift region from adjacent the channel region to adjacent the drain region. Each conductive field plate can be independently biasable and can comprise, for example, discrete polysilicon structures, discrete metal structures or dopant implant regions within the same semiconductor body as the drain drift region. In any case, as in the previously disclosed embodiments, the area between the drain drift region and each conductive field plate can comprise a tapered portion of a trench isolation region that defines the semiconductor body (i.e., can comprise a tapered dielectric region). Alternatively, this area can comprise a tapered depletion region in the semiconductor body.

Also disclosed herein are method embodiments for forming a lateral, extended drain, metal oxide semiconductor, field effect transistor (LEDMOSFET) having a relatively high drain-to-body breakdown voltage (Vb).

One embodiment of the method can comprise forming a trench isolation region to define a semiconductor body and, particularly, an essentially rectangular-shaped semiconductor body in a semiconductor layer. Then, conductive field plates (e.g., discrete metal or polysilicon structures) can be formed adjacent to opposing sides of a drain drift region in the semiconductor body. Specifically, the conductive field plates can be formed either on or extending vertically through the trench isolation region. The conductive field plates can further be formed so that each conductive field plate has a sidewall angled relative to the drain drift region and, thereby so that the area between the drain drift region and each conductive field plate and, particularly, the portion of the trench isolation region between the drain drift region and each conductive plate will have a continuously increasing width along a length of the drain drift region from adjacent a channel region in the semiconductor body to adjacent a drain region in the semiconductor body. Thus, the area between the drain drift region and each conductive field plate will comprise a tapered dielectric region.

Another embodiment of the method can comprise can comprise forming a trench isolation region to define a semiconductor body in a semiconductor layer. In this case, the trench isolation region can specifically be formed such that the semiconductor body has a main portion that is essentially rectangular in shape and additional portions, which are also essentially rectangular in shape, that extend laterally from opposing sides of the main portion. Then, a plurality of dopant implant regions can be formed in the semiconductor body. Specifically, these dopant implant regions can be formed so as to form, in the main portion of the semiconductor body, a channel region, a drain region, and a drain drift region between the channel region and the drain region. The dopant implant regions can further be formed so as to form, in the additional portions of the semiconductor body, conductive field plates adjacent to the opposing sides of the drain drift region, each conductive field plate having a sidewall angled relative to the drain drift region so that the area between the drain drift region and the conductive field plate forms a depletion region having a continuously increasing width along a length of the drain drift region from adjacent the channel region to adjacent the drain region. Thus, the area between the drain drift region and each conductive field plate will comprise a tapered depletion region.

Also disclosed herein are embodiments of a silicon-controlled rectifier (SCR) that incorporates a complementary pair of any two of the LEDMOSFETs disclosed herein. Specifically, the SCR can comprise a semiconductor body, a first LEDMOSFET and a second LEDMOSFET having a different conductivity type than the first LEDMOSFET. The first LEDMOSFET can comprise, in the semiconductor body, a first channel region, a first drain region and a first drain drift region between the first channel region and the first drain region. The first LEDMOSFET can also comprise first conductive field plates adjacent to first opposing sides of the first drain drift region with each first conductive field plate having a first sidewall angled relative to the first drain drift region such that a first area between the first drain drift region and the first conductive field plate has a continuously increasing first width along a first length of the first drain drift region from adjacent the first channel region to adjacent the first drain region. The second LEDMOSFET can comprise, in the semiconductor body, a second channel region abutting the first channel region, a second drain region and a second drain drift region between the second channel region and the second drain region. The second LEDMOSFET can also comprise second conductive field plates adjacent to second opposing sides of the second drain drift region with each second conductive field plate having a second sidewall angled relative to the second drain drift region such that a second area between the second drain drift region and the second conductive field plate has a continuously increasing second width along a second length of the second drain drift region from adjacent the second channel region to adjacent the second drain region. A shared gate structure can be positioned adjacent to channel regions of both LEDMOSFETs.

As in the LEDMOSFET embodiments discussed above, the conductive field plates of the first and second LEDMOSFETs of the SCR can comprise discrete polysilicon structures, discrete metal structures, or dopant implant regions in the semiconductor body. Furthermore, as in the LEDMOSFET embodiments discussed above, the areas between each conductive field plate and the drain drift region in the first and second LEDMOSFETs can comprise either a tapered dielectric region or a tapered depletion region.

BRIEF DESCRIPTION OF THE SEVERAL VIEWS OF THE DRAWINGS

The embodiments disclosed herein will be better understood from the detailed description with reference to the following drawings, which are not necessarily drawn to scale and in which.

DETAILED DESCRIPTION

Figure 1:
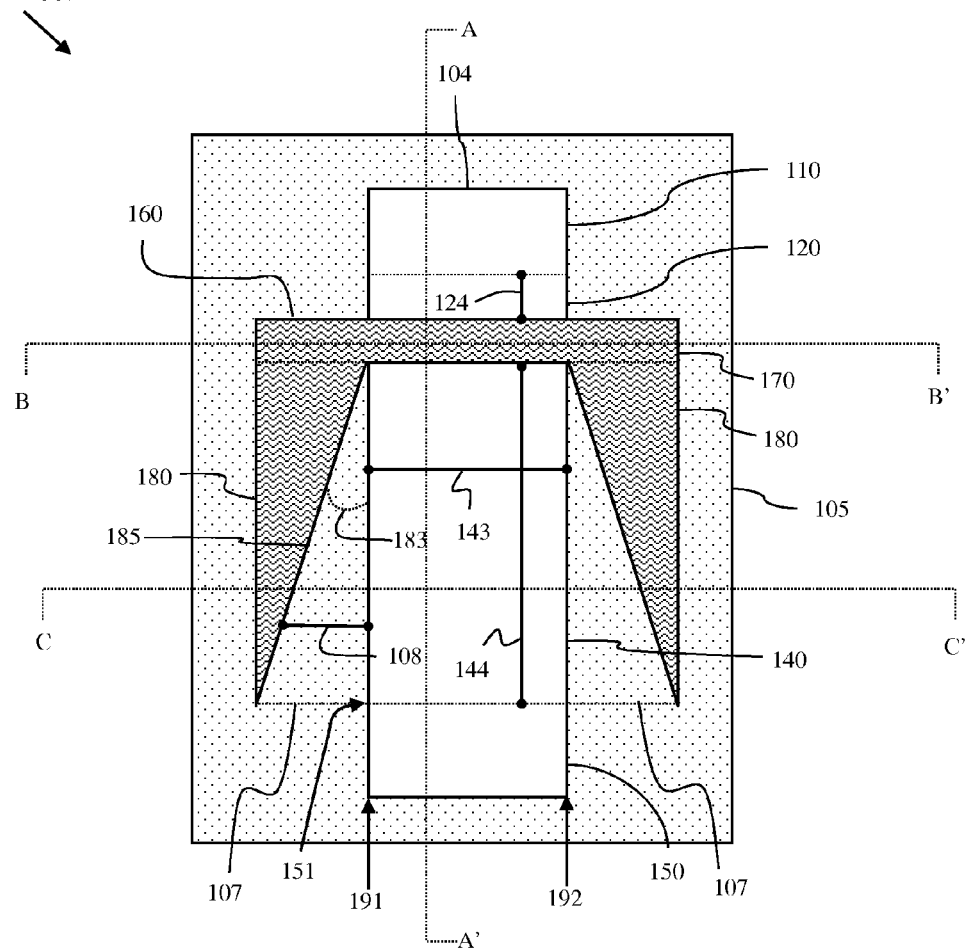
FIG. 1 is a top view illustration of multiple embodiments of an LEDMOSFET.

The disclosed structures and methods and the various features and advantageous details thereof are explained more fully with reference to the non-limiting embodiments that are illustrated in the accompanying drawings and detailed in the following description.

As mentioned above, field effect transistor structures have been developed that balance the need to reduce the short channel effects exhibited by a scaled device with the need for a faster switching speed. For example, one such field effect transistor structure is a lateral, extended drain, metal oxide semiconductor, field effect transistor (LEDMOSFET) that is asymmetric with respect to the source/drain drift region configuration (e.g., the drain drift region can be longer than the source drift region, if any, and can have a lower dopant concentration). Optionally, an LEDMOSFET can also be asymmetric with respect to the halo configuration (e.g., a source-side halo only). Such an LEDMOSFET provides decreased source resistance, increased threshold voltage, decreased off current (Ioff), increased leakage at the source-to-body junction, decreased leakage at the drain-to-body junction, decreased drain-to-gate capacitance and decreased drain-to-body capacitance and, thereby limits short channel effects without decreasing switching speed. Typically such transistors have a drain-to-body breakdown voltage (Vb) of 10-15 volts, making them suitable for use in many applications. However, there are applications that require transistors with higher drain-to-body breakdown voltages. For example, for switch applications, a Vb of greater than 20 volts may be required and, for micro-electronic mechanical (MEMS) applications, a Vb of 30-50 volts may be required.

In view of the foregoing, related U.S. application Ser. No. 12/983,439 disclosed embodiments of a lateral, extended drain, metal oxide semiconductor, field effect transistor (LEDMOSFET) having a relatively high drain-to-body breakdown voltage (Vb). The LEDMOSFET embodiments have gate structure extensions that are positioned adjacent to opposing sides of the drain drift region and function as conductive field plates. In one embodiment, these extensions extend vertically through the isolation region that surrounds the LEDMOSFET. In another embodiment, the extensions sit atop the isolation region. In either case, each extension has a sidewall that is angled relative to the drain drift region such that the portion of the isolation region between the extension and the drain drift region (i.e., the portion of the isolation region that functions as a dielectric field plate) has a continuously increasing width along the length of the drain drift region from the channel region to the drain region. This dielectric field plate, which is tapered from the drain region to the channel region, creates a strong essentially uniform horizontal electric field profile within the drain drift. Such an electric field profile limits the transverse field to the nwell/pwell junction, limits the ionization rate to a safe, low values and allows the drain drift region to be efficiently depleted so that a relatively high specific drain-to-body breakdown voltage is be achieved. Related U.S. application Ser. No. 12/983, 439 also disclosed embodiments of an associated method for forming the LEDMOSFETs with a specific Vb and a program storage device for designing the LEDMOSFETs to have such a specific Vb.

It should be noted that in all of the structure and method embodiments described below the "first conductivity type" and "second conductivity type" will vary depending upon whether described LEDMOSFET is a n-type MOSFET (NFET) or p-type MOSFET (PFET). Specifically, for an NFET, the first conductivity type refers to P-type conductivity and the second conductivity type refers to N-type conductivity. However, for a PFET the reverse is true. That is, for a PFET, the first conductivity type refers to N-type conductivity and the second conductivity type refers to P-type conductivity. Those skilled in the art will recognize that the different dopants can be used to achieve different conductivity types in different semiconductor materials. For example, P-type conductivity can be achieved in silicon or polysilicon through the use of a Group III dopant, such as boron (B) or indium (In) and N-type conductivity can be achieved in silicon or polysilicon through the use of a Group V dopant, such as arsenic (As), phosphorous (P) or antimony (Sb). However, P-type conductivity can be achieved in gallium nitride (GaN) through the use of, for example, magnesium (MG) and N-type conductivity can be achieved in gallium nitride (GaN) through the use of, for example, silicon (Si).

Figure 2:
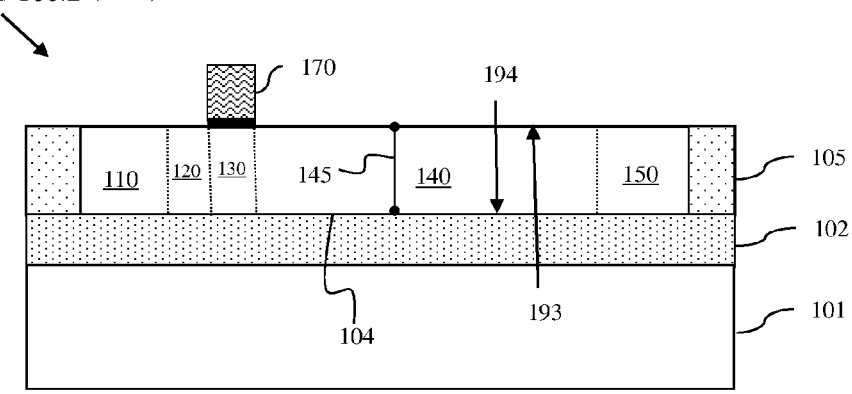
FIG. 2 is a cross-section illustration of the same multiple embodiments of the LEDMOSFET through a vertical plane A-A', as shown in FIG. 1, that cuts across the length of the LEDMOSFET.
Figure 3:
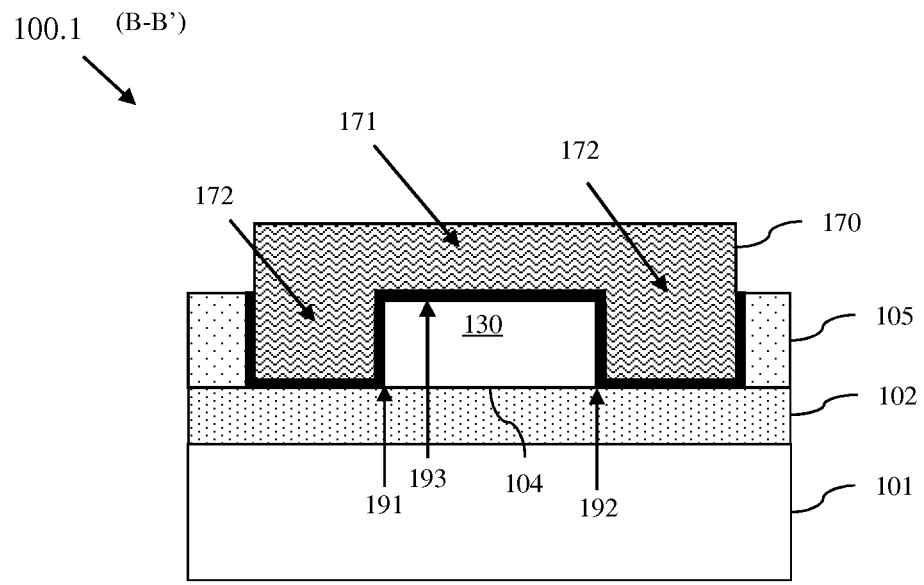
FIG. 3 is a cross-section illustration of a non-planar, multi-gate, LEDMOSFET embodiment through a vertical plane B-B', as shown in FIG. 1, that cuts across the width of a channel region of the LEDMOSFET.
Figure 4:
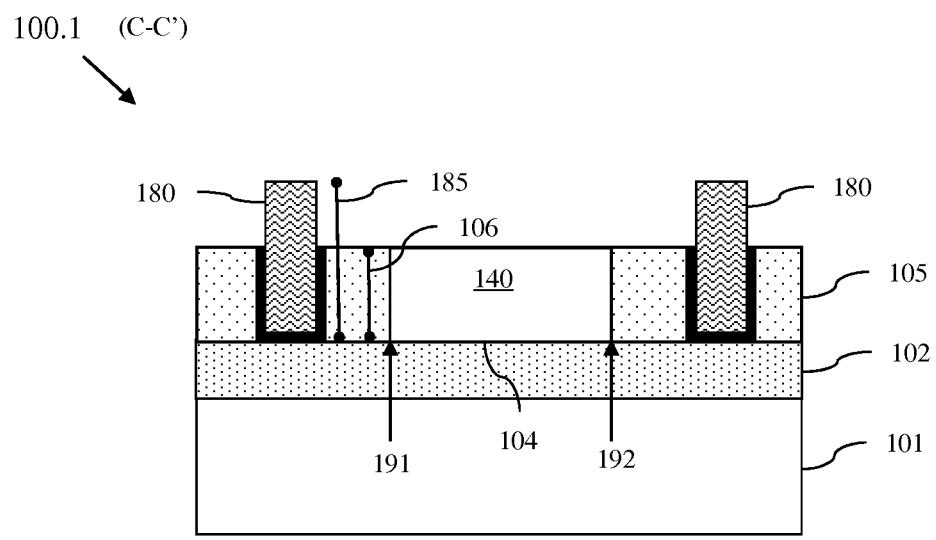
FIG. 4 is another cross-section illustration of the same non-planar, multi-gate, LEDMOSFET embodiment through a vertical plane C-C', as shown in FIG. 1, that cuts across the width of a drain drift region of the LEDMOSFET.
Figure 5:
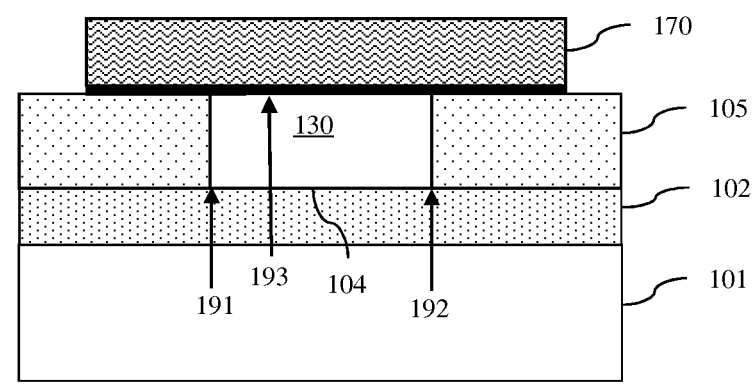
FIG. 5 is a cross-section illustration of a planar LEDMOSFET embodiment through a vertical plane B-B', as shown in FIG. 1, that cuts across the width of a channel region of the LEDMOSFET.
Figure 6:
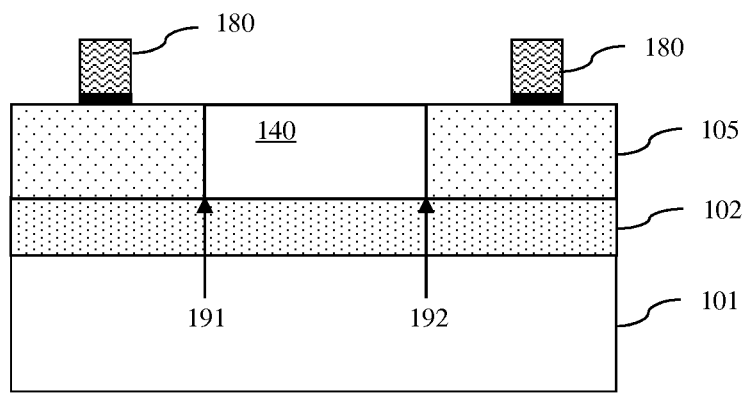
FIG. 6 is another cross-section illustration of the same planar LEDMOSFET embodiment through a vertical plane C-C', as shown in FIG. 1, that cuts across the width of a drain drift region of the LEDMOSFET.

More particularly, as illustrated in FIGS. 1-6, disclosed are embodiments of a lateral, extended drain, metal oxide semiconductor, field effect transistor (LEDMOSFET). The first embodiment 100.1 comprises a non-planar, multi-gate LEDMOSFET, whereas the second embodiment 100.2 comprises a planar LEDMOSFET. Specifically, FIG. 1 is a top view illustration of both the embodiments 100.1 and 100.2 of the LEDMOSFET. FIG. 2 is a cross-section illustration of the embodiments 100.1 and 100.2 of the LEDMOSFET through a vertical plane that cuts across the length of the device (i.e., through the plane A-A' as shown in FIG. 1). FIG. 3 is a cross-section illustration of the embodiment 100.1 of the LEDMOSFET (i.e., the non-planar, multi-gate, LEDMOSFET) through a vertical plane that cuts across the width of the channel region 130 of the device (i.e., through the plane B-B' as shown in FIG. 1). FIG. 4 is another cross-section illustration of the embodiment 100.1 of the LEDMOSFET through a vertical plane that cuts across the width of the drain drift region 140 of the device (i.e., through the plane C-C' as shown in FIG. 1). FIG. 5 is a cross-section illustration of the embodiment 100.2 of the LEDMOSFET (i.e., the planar LEDMOSFET) through a vertical plane that cuts across the width of the channel region 130 of the device (i.e., through the plane B-B' as shown in FIG. 1). FIG. 6 is another cross-section illustration of the embodiment 100.2 of the LEDMOSFET through a vertical plane that cuts across the width of the drain drift region 140 of the device (i.e., through the plane C-C' as shown in FIG. 1).

Referring to FIGS. 1 and 2 in combination, each of these embodiments 100.1 and 100.2 can comprise a semiconductor body 104 (e.g., an essentially rectangular shaped semiconductor body). The semiconductor body 104 can have a top surface 193, a first side 191, and a second side 192 opposite the first side 191. An isolation region 105 can be positioned laterally around the semiconductor body 104.

Specifically, this semiconductor body 104 can comprise a portion of a semiconductor layer of a semiconductor-on-insulator (SOI) wafer. Such an SOI wafer can comprise a semiconductor substrate 101 (e.g., a silicon substrate or other semiconductor substrate), an insulator layer 102 (e.g., a silicon oxide layer or other suitable insulator layer) on the substrate 102 and a semiconductor layer (e.g., a single crystalline silicon layer, a single crystalline gallium nitride layer or other suitable semiconductor layer) on the insulator layer 102. The portion of the semiconductor layer that makes up the semiconductor body 104 can be defined, for example, by a trench isolation region 105. This trench isolation region 105 can, for example, comprise a conventional shallow trench isolation (STI) structure comprising a trench extending vertically through the semiconductor layer to the insulator layer 102 and filled with one or more isolation materials (e.g., a silicon oxide, silicon nitride, silicon oxynitride, etc.). Alternatively, the semiconductor body 104 of the embodiments 100.1 and 100.2 can comprise a portion, as defined by a trench isolation region 105, of a bulk semiconductor wafer (e.g., a single crystalline silicon wafer) or any other suitable wafer (e.g., a hybrid orientation (HOT) wafer) (not shown).

The semiconductor body 104 can comprise the various doped regions typically found in an LEDMOSFET in order to minimize short channel effects and still achieve a relatively fast switching speed. For example, the semiconductor body 104 can comprise a channel region 130 having a first conductivity type and source and drain regions 110, 150, having a second conductivity type, on opposite sides of the channel region 130. Optionally, a halo region 120 and/or a source drift region (not shown) can be positioned laterally between the source region 110 and the channel region 130. The halo region 120 can have the same conductivity type as the channel region 130, but can be doped at a higher concentration so as to reduce short channel effects (e.g., increase threshold voltage (Vt), reduce punch through, etc.). The source drift region can have the same conductivity type as the source region 110, but can be doped at a lesser concentration. A drain drift region 140, but not a halo region, can be positioned laterally between the channel region 130 and the drain region 150. The drain drift region 140 can be relatively long such that the distance 144 between the channel region 130 and the drain region 150 is longer than the distance 124 between the channel region 130 and the source region 110. The drain drift region 140 can also have the same conductivity type as the drain region 110, but can be doped at a lesser concentration. Thus, the embodiments 100.1 and 100.2 of the LEDMOSFET can be asymmetric with respect to the source/drain extension configuration and, optionally, with respect to the halo configuration. Such an LEDMOSFET provides decreased source resistance, increased threshold voltage, decreased off current (Ioff), increased leakage at the source-to-body junction, decreased leakage at the drain-to-body junction, decreased drain-to-gate capacitance and decreased drain-to-body capacitance and, thereby limits short channel effects without decreasing switching speed.

Additionally, the embodiments 100.1 and 100.2 of the LEDMOSFET can incorporate conductive field plates 180 separated from the drain drift region 140 by tapered dielectric plates 107, as discussed in greater detail below, to increase the drain-to-body breakdown voltage (Vb) (e.g., up to or over 40 volts) so that the LEDMOSFET is suitable for high voltage applications (e.g., switch or micro-electronic mechanical (MEMS) applications). Specifically, the embodiments 100.1 and 100.2 of the LEDMOSFET can comprise a gate structure 160. The gate structure 160 can comprise a gate dielectric layer (e.g., a gate oxide layer, a high-k gate dielectric layer or other suitable gate dielectric layer) and a gate conductor layer (e.g., a polysilicon gate conductor layer, a metal gate conductor layer, a dual work function gate conductor layer or other suitable gate conductor layer) on the gate dielectric layer. The gate structure 160 can further comprise a main portion 170 adjacent to the channel region 130 and symmetric extensions 180, which are adjacent to the drain drift region 140 and which function as conductive field plates. Each extension can each have a sidewall 185 (e.g., a linear sidewall) that is angled relative to the semiconductor body 104 such that the portion 107 of the isolation region 105 between the extension 180 and the semiconductor body 104 has a continuously increasing width 108 (e.g., a linearly increasing width) along the length 144 of the drain drift region 140 from the channel region 130 to the drain region 150. In other words, the portion of the isolation region 107, which is between the extension 180 and the drain drift region 140 and which functions as a dielectric field plate, can be tapered along the length 144 of the drain drift region 140 from the drain region 150 to the channel region 130.

The embodiments 100.1 and 100.2 vary depending upon whether the gate structure 160, including the main portion 170 and extensions 180, extends vertically through the isolation region 105 such the LEDMOSFET is a non-planar, multi-gate, LEDMOSFET or whether the gate structure 160 is positioned only above the level of the isolation region 105 such that the LEDMOSFET is a planar LEDMOSFET, respectively.

Specifically, referring to FIGS. 3-4 in combination with FIGS. 1-2, in a non-planar, multi-gate, LEDMOSFET 100.1, the main portion 170 of the gate structure 160 can have a horizontal section 161 positioned adjacent to (i.e., traversing) the channel region 130 on the top surface 193 of the semiconductor body 104 and vertical sections 162 positioned adjacent to the channel region 130 on the first and second sides 191-192 of the semiconductor body 104 (i.e., extending vertically through the isolation region 105, for example, to the insulator layer 102 in the case of an SOI wafer) (see FIG. 3). Thus, in this embodiment 100.1, the LEDMOSFET is a non-planar, multi-gate, field effect transistor. Additionally, in this embodiment, the extensions 180, which function as conductive field plates, can be positioned adjacent to the drain drift region 140 on the first and second sides 191-192 of the semiconductor body. Each extension 180 can extend vertically through the isolation region 105 (e.g., to the insulator layer 102 in the case of an SOI wafer) and can have a first height 185 (e.g., as measured from the top of the insulator layer 102) that is greater than a second height 106 (e.g., also as measured from the top of the insulator layer 102) of the isolation region 105 (see FIG. 4). Each extension 180 can further extend laterally from the main portion 170 of the gate structure 160 at the channel region towards the drain region 150 without extending past the junction between the drain drift region 140 and the drain region 150 (see FIG. 1).

As mentioned above, each extension 180 can each have a sidewall 185 (e.g., a linear sidewall) that is angled (e.g., see angle 183) relative to the semiconductor body 104 such that the portion 107 of the isolation region 105 between the extension 180 and the semiconductor body 104 has a continuously increasing width 108 (e.g., a linearly increasing width) along the length 144 of the drain drift region 140 from the channel region 130 to the drain region 150. In other words, the portion 107 of the isolation region 105, which is between the extension 180 and the drain drift region 140 and which functions as a dielectric field plate, can be tapered along the length 144 of the drain drift region 140 from the drain region 150 to the channel region 130. Such tapered dielectric field plates create a strong uniform horizontal electric field profile within the drain drift region 140 of the semiconductor body 104 (i.e., from the channel region 130 to the drain region 150). This strong uniform electric field profile limits the transverse field to the nwell/pwell junction, limits the ionization rate to a safe, low values and allows the drain drift region to be efficiently depleted so that a relatively high drain-to-body breakdown voltage (e.g., Vb=15-50 volts) can be achieved.

It should be noted that the dimensions of each portion 107 of the isolation region 105 between each extension 180 and the drain drift region 140 (i.e., the dimensions of the tapered dielectric field plates) including, but not limited to, the length and maximum width and, thereby, the dimensions of each extension 180 (i.e., the dimensions of the conductive field plates) including, but not limited to, the angle 183 at which the sidewall 185 is positioned relative to the semiconductor body 104 and the length of the sidewall 185 are predefined based on the dimensions and doping profile of the drain drift region 140 so that the LEDMOSFET 100.1 has a specific drain-to-body breakdown voltage (Vb) (see detailed discussion below with regard to the method embodiments).

Alternatively, referring to FIGS. 5-6 in combination with FIGS. 1-2, in a planar LEDMOSFET 100.2, the main portion 170 of the gate structure 160 can be positioned adjacent to (i.e., traversing) the channel region 130 on the top surface 193 only of the semiconductor body 104 (see FIG. 5). Thus, in this embodiment, the LEDMOSFET 100.2 is a planar field effect transistor. The extensions 180, which function as conductive field plates, can be positioned adjacent to the drain drift region 140 on the first and second sides 191-192 of the semiconductor body 104. Each extension 180 can be above the isolation region 105 (i.e., sit atop the isolation region 105 and not extend vertically through the isolation region 105) (see FIG. 6). Each extension 180 can further extend laterally from the main portion 170 of the gate structure 160 at the channel region towards the drain region 150 without extending past the junction 151 between the drain drift region 140 and the drain region 150 (see FIG. 1).

As with the previously described embodiment, each extension 180 can each have a sidewall 185 (e.g., a linear sidewall) that is angled (e.g., see angle 183) relative to the semiconductor body 104 such that the portion 107 of the isolation region 105 between the extension 180 and the semiconductor body 104 has a continuously increasing width 108 (e.g., a linearly increasing width) along the length 144 of the drain drift region 140 from the channel region 130 to the drain region 150. In other words, the portion 107 of the isolation region 105, which is between the extension 180 and the drain drift region 140 and which functions as a dielectric field plate, can be tapered along the length 144 of the drain drift region 140 from the drain region 150 to the channel region 130. Such tapered dielectric field plates similarly create a strong essentially uniform horizontal electric field profile within the drain drift region 140 of the semiconductor body 104 (i.e., from the channel region 130 to the drain region 150). This strong essentially uniform electric field profile limits the transverse field to the nwell/pwell junction, limits the ionization rate to safe, low values and allows the drain drift region to be efficiently depleted so that a relatively high drain-to-body breakdown voltage (e.g., Vb=15-30 volts) can be achieved. While this embodiment may not allow for a horizontal electric field profile that is as strong as that in the previously described embodiment may and, thus, may not allow for as high of an increase in the Vb it still allows for a higher Vb than seen in the prior art.

Again, it should be noted that the dimensions of each portion 107 of the isolation region 105 between each extension 180 and the drain drift region 140 (i.e., the dimensions of the tapered dielectric field plates) including, but not limited to, the length and maximum width and, thereby, the dimensions of each extension 180 (i.e., the dimensions of the conductive field plates) including, but not limited to, the angle 183 at which the sidewall 185 is positioned relative to the semiconductor body 104 and the length of the sidewall 185 are predefined based on the dimensions and doping profile of the drain drift region 140 so that the LEDMOSFET 100.2 has a specific drain-to-body breakdown voltage (Vb) (see detailed discussion below with regard to the method embodiments).

Those skilled in the art will recognize that, like other non-planar, multi-gate FETs, the effective channel width and, thereby the drive current of the first embodiment 100.1 described above can be increased by incorporating multiple fingers (i.e., fins) into the structure, as opposed to a single semiconductor body. Therefore, referring to FIGS. 7-10, also disclosed is an embodiment of a multi-finger (i.e., multi-fin) LEDMOSFET 200. Specifically, referring to FIGS. 7 and 8 in combination, the LEDMOSFET 200 can comprise a semiconductor body 204. This semiconductor body 204 can comprise multiple semiconductor fingers (i.e., semiconductor fins) 214a-c extending laterally between and perpendicular to two shared semiconductor end regions 215, 255. Each semiconductor finger (i.e., each fin) 214a-c can have a top surface 293, a first side 291, and a second side 292 opposite the first side 291. An isolation region 205 can be positioned laterally around the semiconductor body 204 and also between each finger 214a-c. As in the embodiments 100.1 and 100.2 described above, this semiconductor body 204 can comprise a portion of a semiconductor layer of a semiconductor-on-insulator (SOI) wafer, as defined, for example, by a trench isolation region 205. Alternatively, the semiconductor body 204 can comprise a portion, as defined by an isolation region 205, of a bulk semiconductor wafer (e.g., a single crystalline silicon wafer) or any other suitable wafer (e.g., a hybrid orientation (HOT) wafer) (not shown).

The semiconductor body 204 can further comprise the various doped regions typically found in a multi-finger (i.e., multi-fin) LEDMOSFET to minimize short channel effects and still achieve a relatively fast switching speed. For example, each semiconductor finger (i.e., each semiconductor fin) 214a-c can comprise a channel region 230a-c having a first conductivity type and the end regions 215, 255 can comprise source and drain regions 210, 250, having a second conductivity type. Optionally, a halo region can be positioned laterally between the source region 210 and each channel region 230a-c, for example, either within each finger (as shown, see halo regions 230a-c) or within the end region 215. The halo region(s) can have the same conductivity type as the channel regions 230a-c, but can be doped at a higher concentration so as to reduce short channel effects (e.g., increase threshold voltage (Vt), reduce punch through, etc.). A drain drift region 240a-c, but no halo region can be positioned within each finger 214a-c between corresponding channel region 230a-c and the drain region 250. Each drain drift region 240a-c can be relatively long such that the distance between the channel region 230a-c and the drain region 250 is longer than the distance between the channel region 230a-c and the source region 210. The drain drift regions 240a-c can have the same conductivity type as the drain region 210, but can be doped at a lesser concentration. Thus, the LEDMOSFET 200 can be asymmetric with respect to the source/drain extension configuration and, optionally, with respect to the halo configuration.

Additionally, the LEDMOSFET 200 can incorporate conductive field plates 280a-c separated from the drain drift regions 240a-c within each finger 214a-c by tapered dielectric plates 207a-c to increase the drain-to-body breakdown voltage (Vb) (e.g., up to or over 40 volts) so that the LEDMOSFET is suitable for high voltage applications (e.g., switch or micro-electronic mechanical (MEMS) applications). Specifically, the LEDMOSFET 200 can comprise a gate structure 260. The gate structure 260 can comprise a gate dielectric layer and a gate conductor layer on the gate dielectric layer. The gate structure 260 can further comprise a main portion 270 adjacent to the channel regions 230a-c and also extensions 280a-c, which are adjacent to the drain drift regions 240a-c and which function as conductive field plates.

Figure 7:
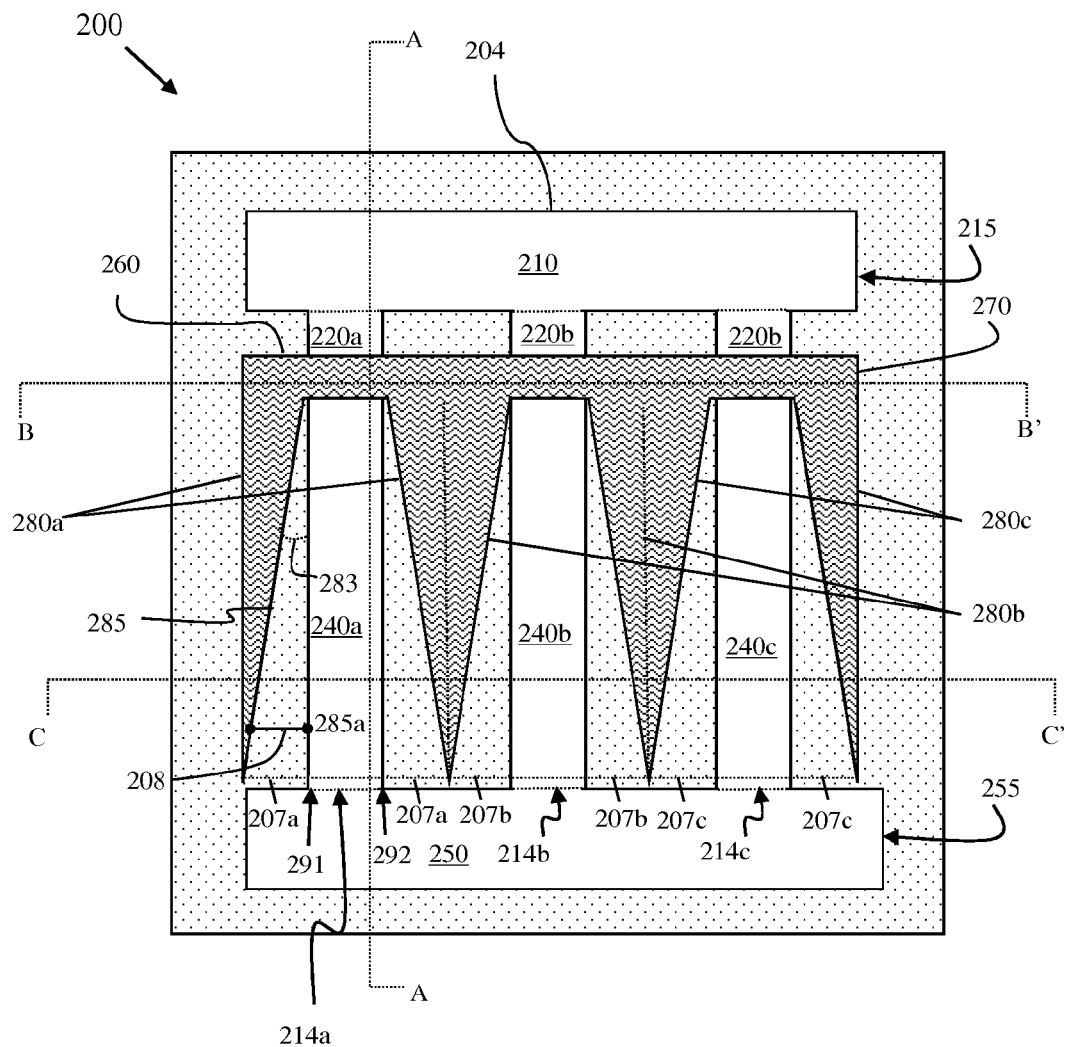
FIG. 7 is a top view illustration of an embodiment of a multi-finger LEDMOSFET.
Figure 8:
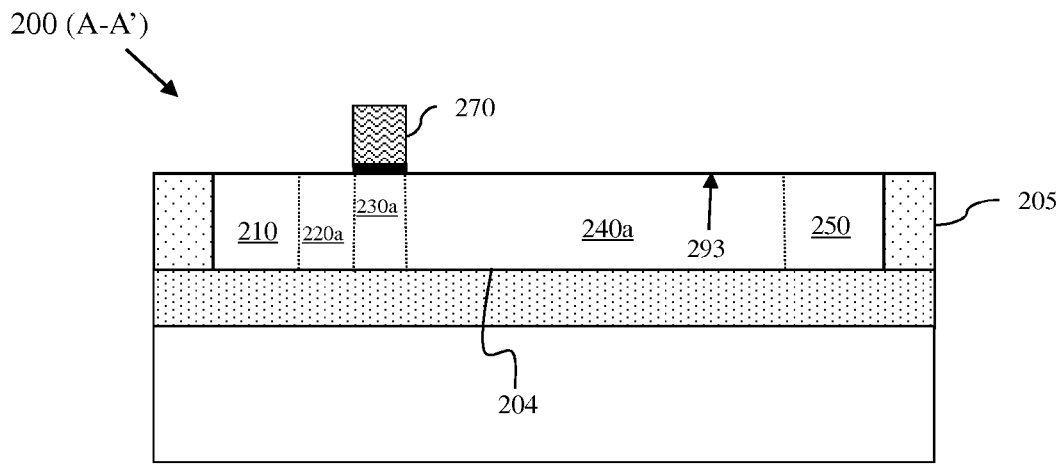
FIG. 8 is a cross-section illustration of the same multi-finger LEDMOSFET through a vertical plane A-A', as shown in FIG. 7, that cuts across the length of a single finger of the LEDMOSFET.
Figure 9:
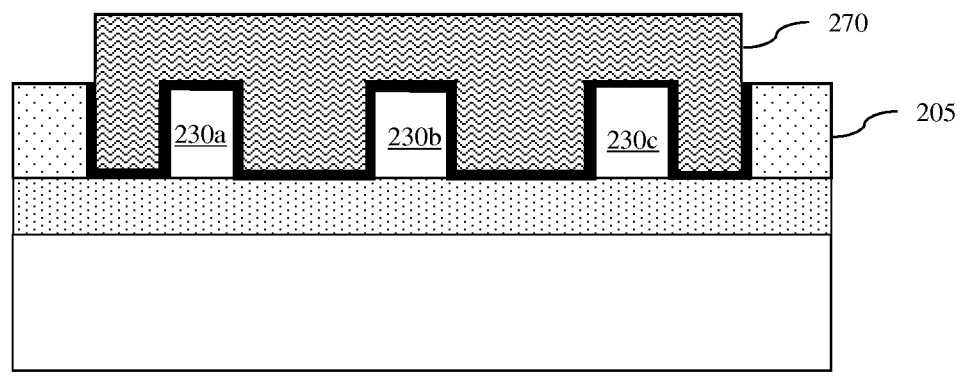
FIG. 9 is a cross-section illustration of the same multi-finger LEDMOSFET through a vertical plane B-B', as shown in FIG. 7, that cuts across the width of the channel regions within each finger of the LEDMOSFET.
Figure 10:
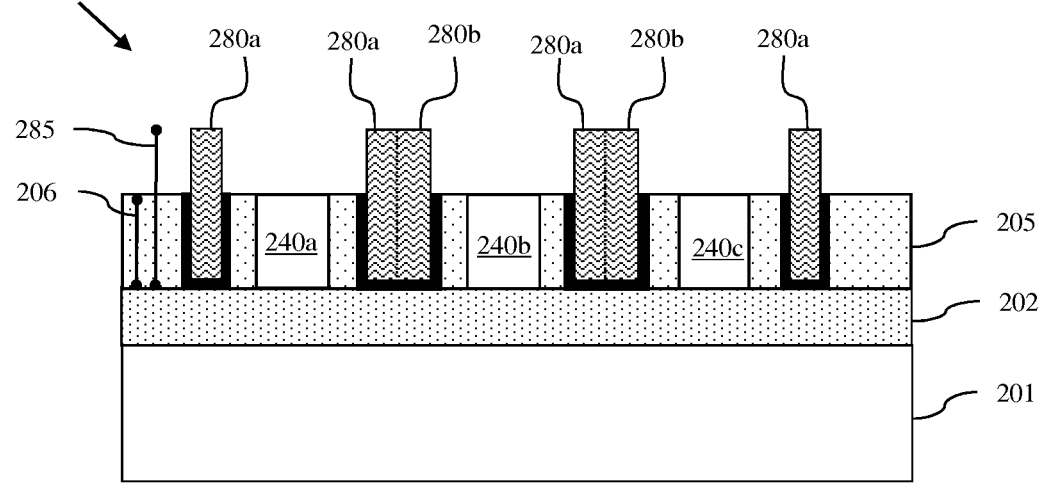
FIG. 10 is another cross-section illustration of the same multi-finger LEDMOSFET through a vertical plane C-C', as shown in FIG. 7, that cuts across the width of the drain drift regions within each finger of the LEDMOSFET.

Referring to FIGS. 9-10 in combination with FIGS. 7-8, the main portion 270 of the gate structure 260 can have a horizontal section positioned adjacent to (i.e., traversing) the channel regions 230a-c on the top surface 293 of the semiconductor body 204 and vertical sections positioned adjacent to the channel regions 230a-c on the first and second sides 291-292 of each semiconductor finger 214a-c (i.e., extending vertically through the isolation region 205, for example, to the insulator layer in the case of an SOI wafer) (see FIG. 7). The extensions 280a-c can be positioned adjacent to each drain drift region 240a-c on the first and second sides 291-292 of each semiconductor finger 214a-c. Each extension can extend vertically through the isolation region 205 (e.g., to the insulator layer in the case of an SOI wafer) and can have a first height 285 (e.g., as measured from the top of the insulator layer) that is greater than a second height 206 (e.g., also as measured from the top of the insulator layer) of the isolation region 205 (see FIG. 10). Each extension can further extend laterally from the main portion 270 of the gate structure 260 at the channel regions towards the drain region 250 without extending past the junctions between the drain drift regions 240a-c and the drain region 250 (see FIG. 7).

Additionally, each extension 280a-c can have a sidewall 285 (e.g., a linear sidewall) that is angled (e.g., see angle 283) relative to a corresponding semiconductor finger 214a-c so that each portion 207a-c of the isolation region 205 that is between an extension 280a-c and a semiconductor finger 214a-c has a continuously increasing width 208 (e.g., a linearly increasing width) along the length of the drain drift region within the finger 214a-c from the channel region 230a-c to the drain region 250. In other words, each portion 207a-c of the isolation region 205, which is between an extension 280a-c and a drain drift region 240a-c and which functions as a dielectric field plate, can be tapered along the length of that drain drift region 240a-c from the drain region 250 to the channel region 230a-c. Such tapered dielectric field plates create a strong essentially uniform horizontal electric field profile within the drain drift regions 240a-c of the semiconductor fingers 214a-c (i.e., from the channel regions 230a-c to the drain region 250). This strong essentially uniform electric field profile limits the transverse field to the nwell/pwell junction, limits the ionization rate to safe, low values and allows the drain drift regions to be efficiently depleted so that a relatively high drain-to-body breakdown voltage (e.g., Vb=15-50 volts) can be achieved. It should be noted that the dimensions of each portion 207a-c of the isolation region 205 between each extension 280a-c and a drain drift region 240a-c (i.e., the dimensions of the tapered dielectric field plates) including, but not limited to, the length and maximum width and, thereby, the dimensions of each extension 280a-c (i.e., the dimensions of the conductive field plates) including, but not limited to, the angle 283 at which each sidewall 285 is positioned relative to a corresponding semiconductor finger 214*a-c* and the length of each linear sidewall 285 are predefined based on the dimensions and doping profile of the drain drift regions 240*a-c* so that the LEDMOSFET 200 has a specific drain-to-body breakdown voltage (Vb) (see detailed discussion below with regard to the method embodiments).

It should be noted that in any of the above-described LEDMOSFET structures 100.1, 100.2 and 200, the body of the LEDMOSFET can be either floating (i.e., non-contacted) or contacted. Various body contact structures for MOSFETs are well-known in the art. Thus, the details of such body contact structures are omitted from this specification in order to allow the reader to focus on the salient aspects of the embodiments.

Figure 11:
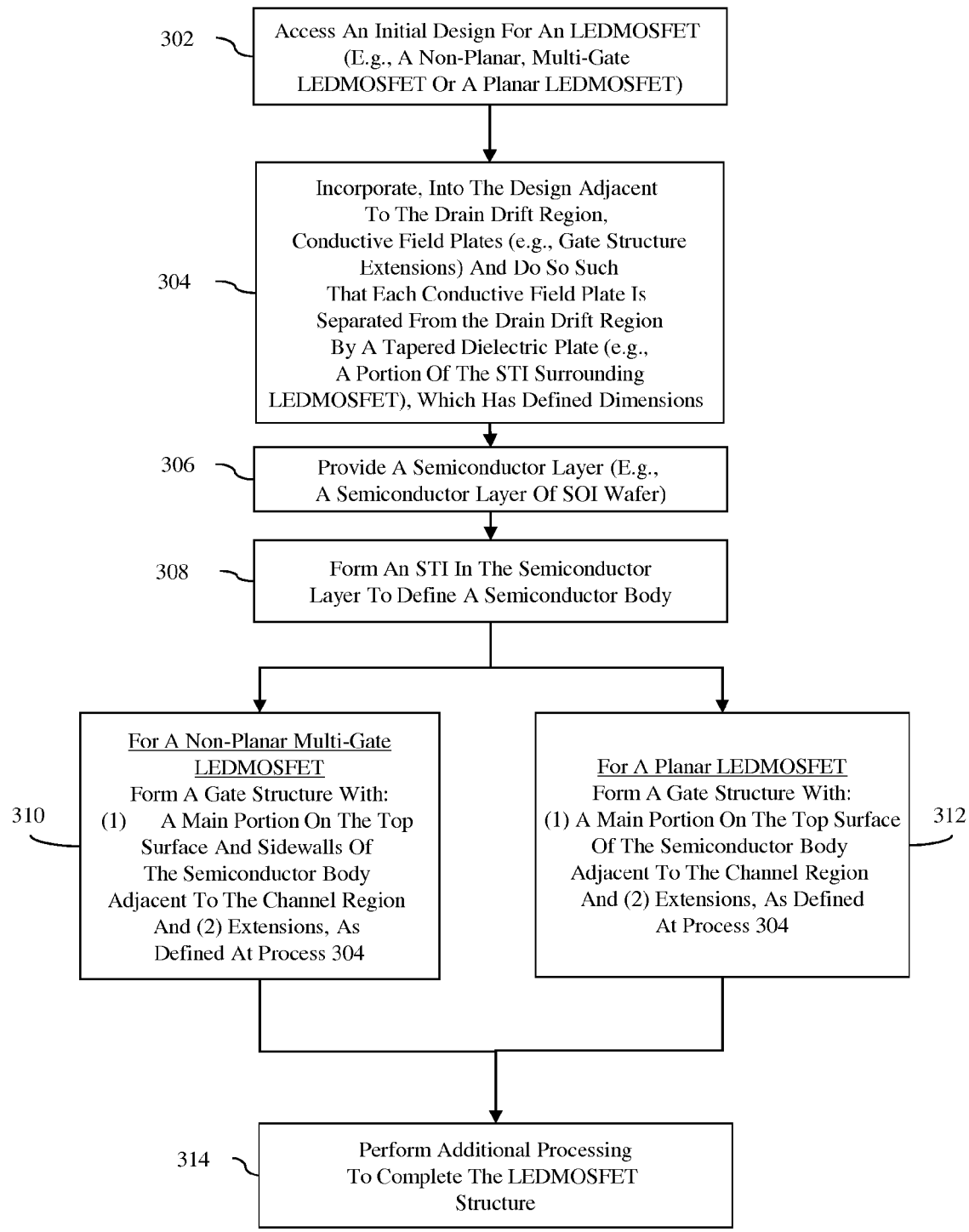
FIG. 11 is a flow diagram illustrating method embodiments for forming the LEDMOSFETs above.

Referring to the flow diagram of FIG. 11, also disclosed are method embodiments for forming both the non-planar, multi-gate, LEDMOSFET 100.1, as described above and illustrated in FIGS. 1-4, and the planar LEDMOSFET 100.2, as described above and illustrated in FIGS. 1-2 and 5-6. The method embodiments can comprise accessing an initial design for an LEDMOSFET (302). The initial design can, for example, be stored in a data storage device of a computer system and can comprise a high-level description, which sets out the requirements and specifications for the LEDMOSFET in a hardware description language (HDL) (e.g., VHDL or Verilog).

Next, the method embodiments can comprise incorporating, into the design, conductive field plates 180 adjacent to a drain drift region and, doing so, such that each gate extension 180 (i.e., each conductive field plate) will be separated from that drain drift region 140 by a tapered dielectric plate 107, which has defined dimensions, in order to increase the drain-to-body breakdown voltage (Vb) of the LEDMOSFET to a specific level (e.g., 15, volts, 20 volts, 30 volts, 40 volts, 50 volts etc.) (304). As shown in FIG. 1, these conductive field plates 180 can comprise extensions of the LEDMOSFET gate structure and the tapered dielectric plates 107 can comprise defined portions of the isolation region 105 which surrounds the LEDMOSFET.

In one embodiment, the design that is accessed at process 302 can be for a non-planar, multi-gate, LEDMOSFET. Referring to FIGS. 1-4, this non-planar, multi-gate, LEDMOSFET design can comprise a semiconductor body 104 having a top surface 193, a first side 191, and a second side 192 opposite the first side 191. The semiconductor body 104 can comprise at least a channel region 130, drain drift region 140 positioned laterally adjacent to the channel region 130, and a drain region 150 positioned laterally adjacent to the drain drift region 140 opposite the channel region 130. This non-planar, multi-gate, LEDMOSFET design can further comprise an isolation region 105 positioned laterally around the semiconductor body 104 and a gate structure 170 adjacent to the channel region 130 on the top surface 193 and on the first side 191 and the second side 192 of the semiconductor body 104, extending vertically through the isolation region 105 (e.g., to an insulator layer 102).

Gate structure extensions 180, as shown in FIGS. 1 and 4, can be incorporated into this design at process 304 such that each extension 180 extends vertically through the isolation region 105 (e.g., to an insulator layer 102) and such that each extension 180 further extends laterally from the gate structure 170 toward the drain region 150. Each extension 180 can further have a sidewall 185 (e.g., a linear sidewall) that is angled (e.g., see angle 183) relative to the semiconductor body 104 such that a portion 107 of the isolation region 105 between the extension 180 and the semiconductor body 104 will have a continuously increasing width 108 (e.g., a linearly increasing width) along the length 144 of the drain drift region 140 from the channel region 130 to the drain region 150. In other words, by design, the portion 107 of the isolation region 105, which will be between the extension 180 and the drain drift region 140 and which will function as a dielectric field plate, will be tapered along the length 144 of the drain drift region 140 from the drain region 150 to the channel region 130.

In another embodiment, the design that is accessed at process 302 can be for a planar LEDMOSFET. Referring to FIGS. 1-2 and 5-6, this planar LEDMOSFET design can similarly comprise a semiconductor body 104 having a top surface 193, a first side 191, and a second side 192 opposite the first side 191. The semiconductor body 104 can comprise at least a channel region 130, drain drift region 140 positioned laterally adjacent to the channel region 130, and a drain region 150 positioned laterally adjacent to the drain drift region 140 opposite the channel region 130. This planar LEDMOSFET design can further comprise an isolation region 105 positioned laterally around the semiconductor body 104 and a gate structure 170 adjacent to the channel region 130 on the top surface 193 only of the semiconductor body 104.

Gate structure extensions 180, as shown in FIGS. 1 and 6, can be incorporated into this design at process 304 such that each extension 180 is above the isolation region 105 (i.e., sits atop the isolation region 105 and does not extend vertically through the isolation region 105) and further such that each extension 180 extends laterally from the gate structure 170 toward the drain region 150. Each extension 180 can further have a sidewall 185 (e.g., a linear sidewall) that is angled (e.g., see angle 183) relative to the semiconductor body 104 such that a portion 107 of the isolation region 105 between the extension 180 and the semiconductor body 104 will have a continuously increasing width 108 (e.g., a linearly increasing width) along the length 144 of the drain drift region 140 from the channel region 130 to the drain region 150. In other words, by design, the portion 107 of the isolation region 105, which will be between the extension 180 and the drain drift region 140 and which will function as a dielectric field plate, will be tapered along the length 144 of the drain drift region 140 from the drain region 150 to the channel region 130.

In either case, the process 304 of incorporating such extensions 180 into the design can comprise defining (i.e., predetermining) the dimensions of each portion 107 of the isolation region 105 (i.e., each tapered dielectric plate) that will be between an extension 180 (i.e., a conductive field plate) and the semiconductor body 104, including, but not limited to, defining the length and maximum width of that portion 107 and, thereby, defining the dimensions of each extension 180 including, but not limited to, defining the angle 183 at which the sidewall 185 of each extension 180 will be positioned relative to the semiconductor body 104 and the length of the sidewall 185. The dimensions can specifically be defined (i.e., determined, calculated, etc.) based on the specifications set out in the design for the drain drift region 140 in order to form a field effect transistor 100.1 or 100.2 that will have an essentially uniform horizontal electric field profile within the drain drift region 140 and a specific drain-to-body breakdown voltage (Vb). These specifications can include, but are not limited to, the specified width 143 for the drain drift region 140 from the first side 191 to the second side 192 of the semiconductor body 104, the specified length 144 of the drain drift region 140 from the channel region 130 to the drain region 150, the specified height 145 for the drain drift region 140 (e.g., as measured from the top surface an insulator layer below, in the case an SOI device) and the specified doping profile for the drain drift region 140

It should be noted that, while the planar LEDMOSFET embodiment 100.2 may not allow for a horizontal electric field profile that is as strong as that in non-planar, multi-gate, LEDMOSFET embodiment 100.2 and, thus, may not allow for as high of an increase in the Vb it still allows for a higher Vb than that seen in the prior art. That is, for example, in the LEDMOSFET embodiment 100.1 a Vb ranging between 15 volts and 50 volts can be achieved and in the LEDMOSFET embodiment 100.2 a Vb ranging between 15 volts and 30 volts can be achieved. In either case, this is over the Vb of 10-15 volts typically seen in conventional LEDMOSFETs.

More specifically, the following formula can be used to calculate the optimal dimensions for the tapered dielectric field plates 107 and conductive field plates 180. The variation of the tapered dielectric thickness can be found as a function of the lateral field variation Ex. Specifically, the tapered dielectric thickness tdielectric (x) is given as: tdielectric (x)=Ex $\in$0 $\in$dielectric*x/(q Nd tsemi)+C, where Ex is the lateral electrical field, Nd is the doping level in the drift region, tsemi is the half-width of the semiconductor body and C is a constant. Such a formula describes the variation of the lateral and vertical electrical field in both the SOI silicon body and the tapered dielectric.

Figure 12:
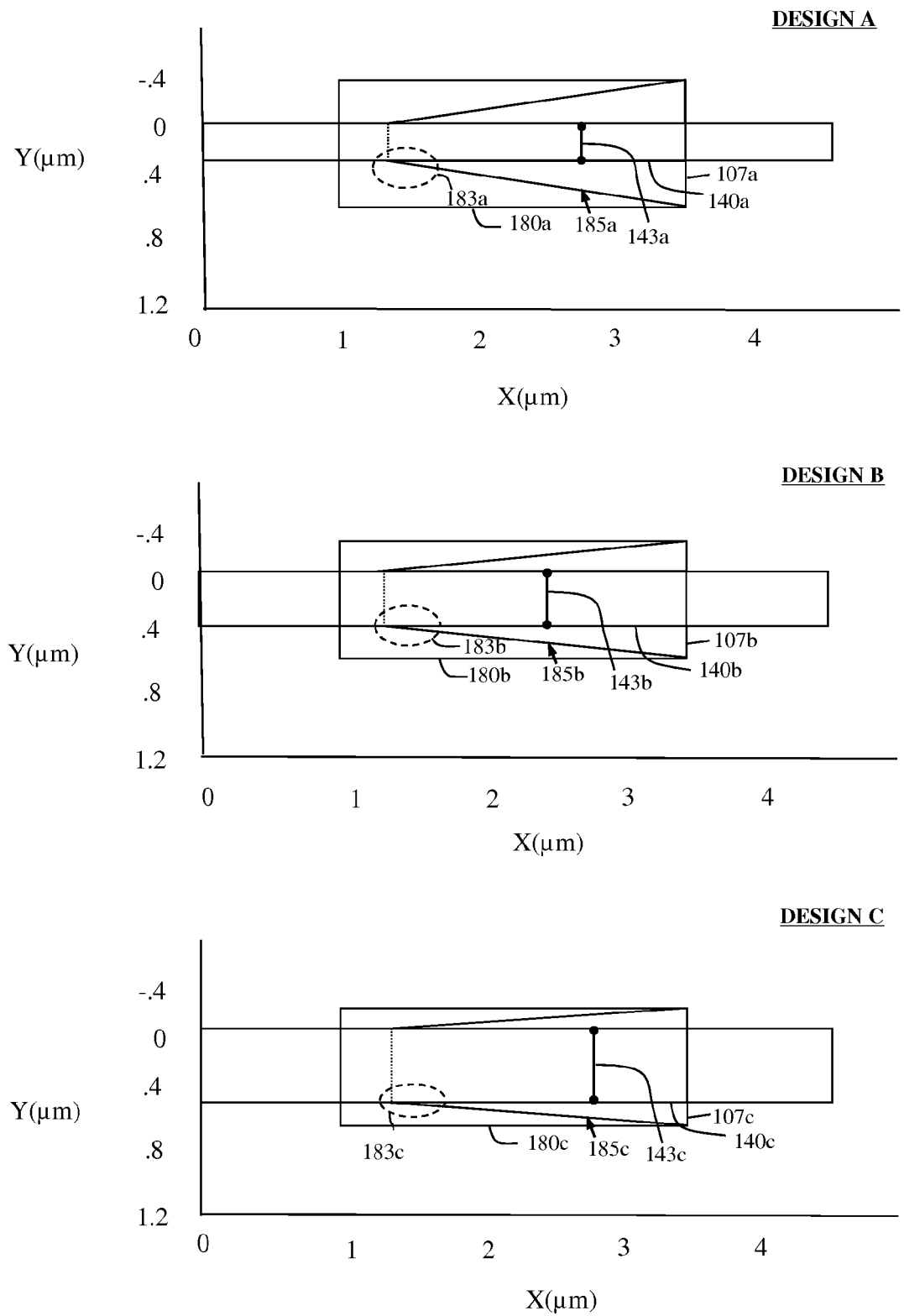
FIG. 12 is a diagram illustrating process step 304 of the flow diagram of FIG. 11.

Thus, it should be understood that the dimensions of the tapered dielectric field plates 107 and conductive field plates 180 in either the non-planar, multi-gate, LEDMOSFET 100.1 or the planar LEDMOSFET 100.2 will vary depending upon the various specifications for the drain drift region 140 and the desired Vb. For example, as illustrated in FIG. 12, if three designs A, B and C vary only with respect to the specified width for the drain drift region, then the maximum width of the tapered dielectric plate and, thereby, the angle of the conductive field plate sidewall relative to the drain drift region can be varied in order to achieve the same Vb. That is, Design A, which has the narrowest drain drift region width 143a, will require a tapered dielectric field plate 107a with the greatest maximum width and, thereby, a conductive field plate 180a with a sidewall 185a at the greatest angle 183a relative to the drain drift region 140a. Design B, which has the next narrowest drain drift region width 143b, will require a tapered dielectric field plate 107b with the next greatest maximum width and, thereby, a conductive field plate 180b with a sidewall 185b at the next greatest angle 183b relative to the drain drift region 140b. Finally, design C, which has the widest drain drift region width 143c, will require a tapered dielectric field plate 107c with the narrowest maximum width and, thereby, a conductive field plate 180c with a sidewall 185c at the smallest angle 183c relative to the drain drift region 140c. Once the dimensions are defined at process 304, the LEDMOSFET 100.1 or 100.2 can be formed.

Figure 13:
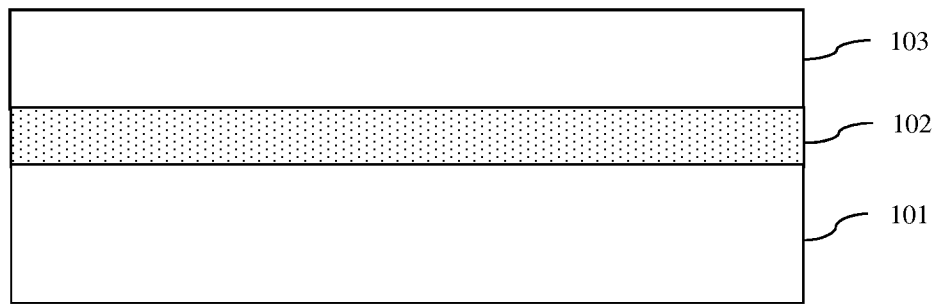
FIG. 13 is a cross-section diagram of a partially completed LEDMOSFET formed according to the method of FIG. 11.

Specifically, a semiconductor layer 103, having a first conductivity type, can be provided (306, see FIG. 13). This semiconductor layer 103 can, for example, comprise a semiconductor layer of a semiconductor-on-insulator (SOI) wafer. Such an SOI wafer can comprise a semiconductor substrate 101 (e.g., a silicon substrate or other semiconductor substrate), an insulator layer 102 (e.g., a silicon oxide layer or other suitable insulator layer) on the substrate 102 and a semiconductor layer 103 (e.g., a single crystalline silicon layer, a single crystalline gallium nitride layer or other suitable semiconductor layer) on the insulator layer 102. Alternatively, the semiconductor layer can comprise the upper portion of a bulk semiconductor wafer (e.g., a single crystalline silicon wafer) or any other suitable wafer (e.g., a hybrid orientation (HOT) wafer) (not shown).

Figure 14A:
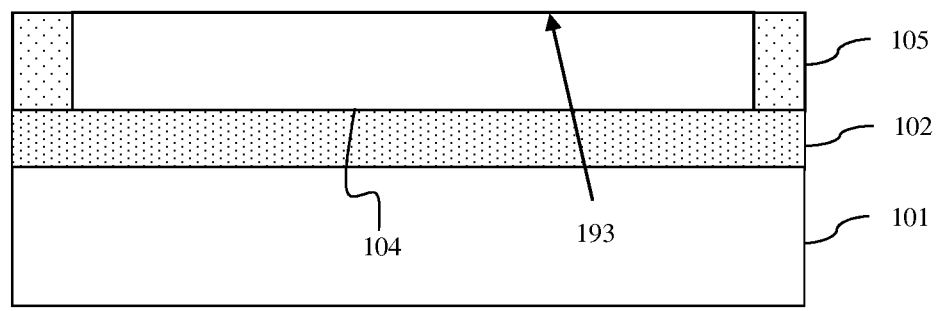
FIG. 14A is a cross-section diagram of a partially completed LEDMOSFET formed according to the method of FIG. 11.
Figure 14B:
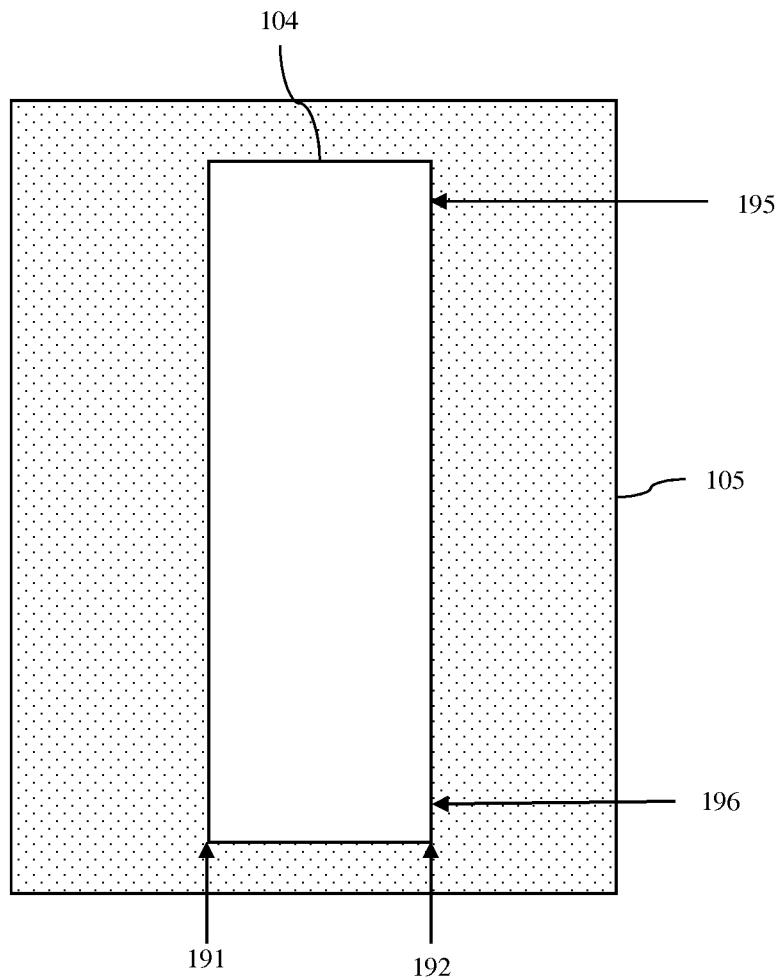
FIG. 14B is a different cross-section diagram of the same partially completed LEDMOSFET as shown in FIG. 14A.

Next, an isolation region 105 can be formed in the semiconductor layer 103 so as to form a semiconductor body 104 laterally surrounded by the isolation region 105 (308, see FIGS. 14A and 14B). Specifically, a trench isolation structure 105 can be formed that extends vertically through the semiconductor layer 103 (e.g., to the insulator layer 102, in the case of an SOI wafer) in order to define the shape of the semiconductor body 104 (i.e., to define the shape of the active region of the LEDMOSFET 100.1 or 100.2) and electrically isolate the semiconductor body 104 from other active regions on the wafer. The trench isolation structure 105 can be formed, for example, using conventional shallow trench isolation (STI) formation techniques. That is, a trench can be formed (e.g., using lithographic patterning techniques) and, then, filled with one or more isolation materials (e.g., a silicon oxide, silicon nitride, silicon oxynitride, etc.). The shape of the semiconductor body 104, as defined by the trench isolation structure 105, can be essentially rectangular. The resulting semiconductor body 104 can have a top surface 193, a first side 191, a second side 192 opposite the first side 191 and opposing ends 195, 196.

The design for the LEDMOSFET can designate various areas of this semiconductor body 104 for subsequent formation (e.g., by doping) of different components of the LEDMOSFET as well the dimensions, conductivity type, doping profiles, etc. for those components. For example, by design, this semiconductor body 104 can have a designated source region 110 at the end 195, an optional designated halo region 120 positioned laterally adjacent to the designate source region 110, a designated channel region 130 positioned laterally adjacent to the designated halo region 120, a designated drain drift region 140 positioned laterally adjacent to the designated channel region 130 and a designated drain region 150 at end 196 positioned laterally adjacent to the drain drift region 140.

After the isolation region 105 is formed at process 308, a gate structure 160 can be formed (see step 310 for a non-planar, multi-gate, LEDMOSFET 100.1 and step 312 for a planar LEDMOSFET 100.2).

For a non-planar, multi-gate, LEDMOSFET 100.1, a gate structure 160 can be formed at process 310 with a main portion 170 and with extensions 180, as defined at process 304 and illustrated in FIGS. 1-4 (310). Specifically, the gate structure 160 can be formed such that it has a main portion 170 adjacent to the designated channel region 130. The main portion 170 can have a horizontal section 171 positioned on the top surface 193 of the semiconductor body 104 and vertical sections 172 positioned on the first and second sides 191, 192 of the semiconductor body 104, as shown in FIG. 3. The gate structure 160 can further be formed such that it has extensions 180 positioned adjacent to the designated drain drift region 140. Each extension 180 can extend vertically through the isolation region 105 and can further extend laterally from the main portion 170 of the gate structure 160 at the channel region towards the designated drain region 140 without extending past the junction 151 between the designated drain drift region 140 and the designated drain region 150. Additionally, each extension 180 can have a sidewall 185 (e.g., a linear sidewall) that is angled relative to the semiconductor body 104 such that a portion 107 of the isolation region 105 between the extension 180 and the semiconductor body 104 has the dimensions defined at process 304 and, particularly, has a continuously increasing width 108 (e.g., a linearly increasing width) along the length 144 of the designated drain drift region 140 from the designated channel region 130 to the designated drain region 150. In other words, the each extension 180 of the gate structure is formed such that a portion 107 of the isolation region 105, which remains between the extension 180 and the designated drain drift region 140 and which will function as a dielectric field plate, is tapered along the length 144 of the designated drain drift region 140 from the designated drain region 150 to the designated channel region 130 and has the specific dimensions defined at process 304.

Figure 15:
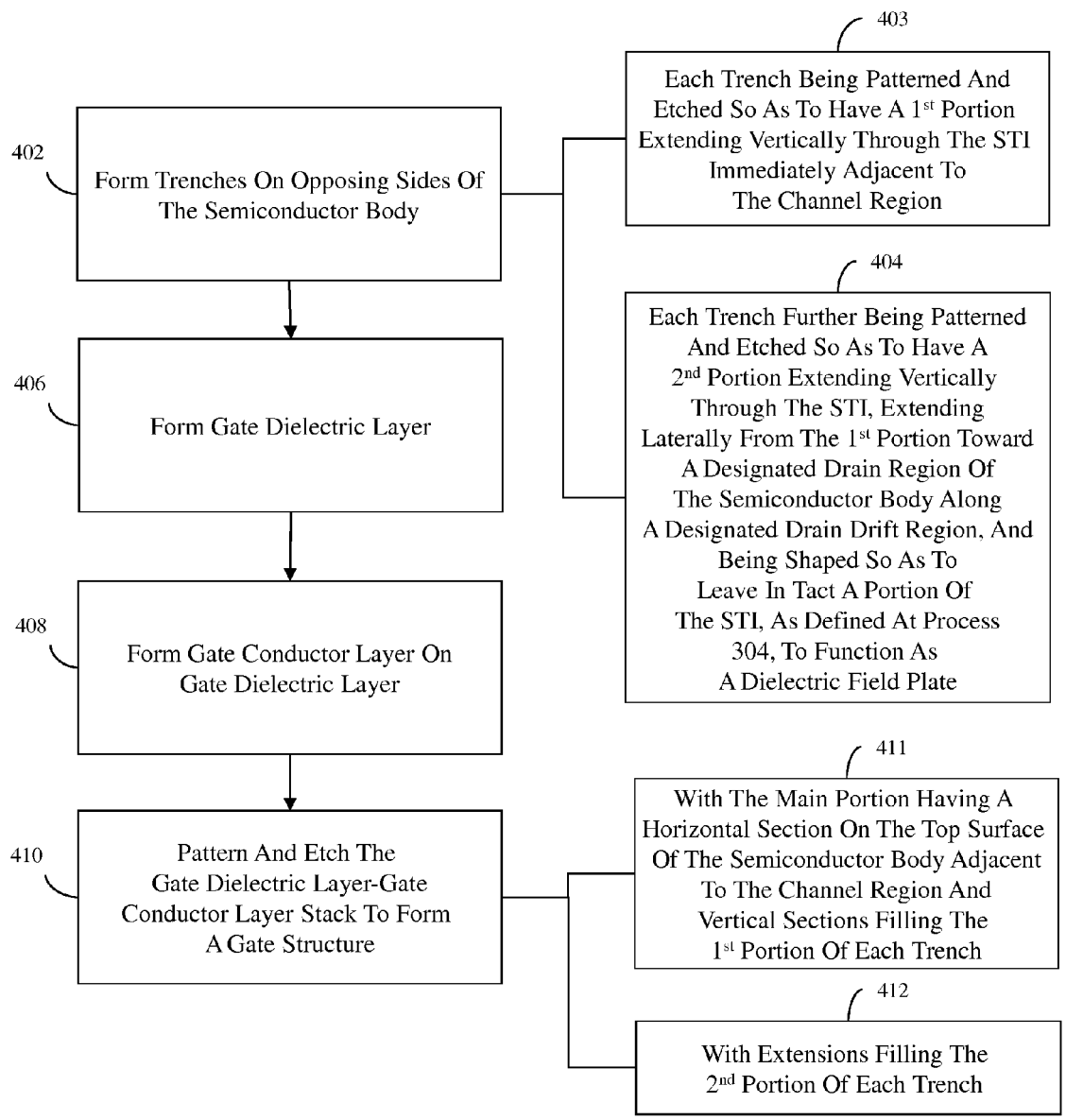
FIG. 15 is a flow diagram illustrating an exemplary technique for forming a gate structure at step 310 of FIG. 11.
Figure 16:
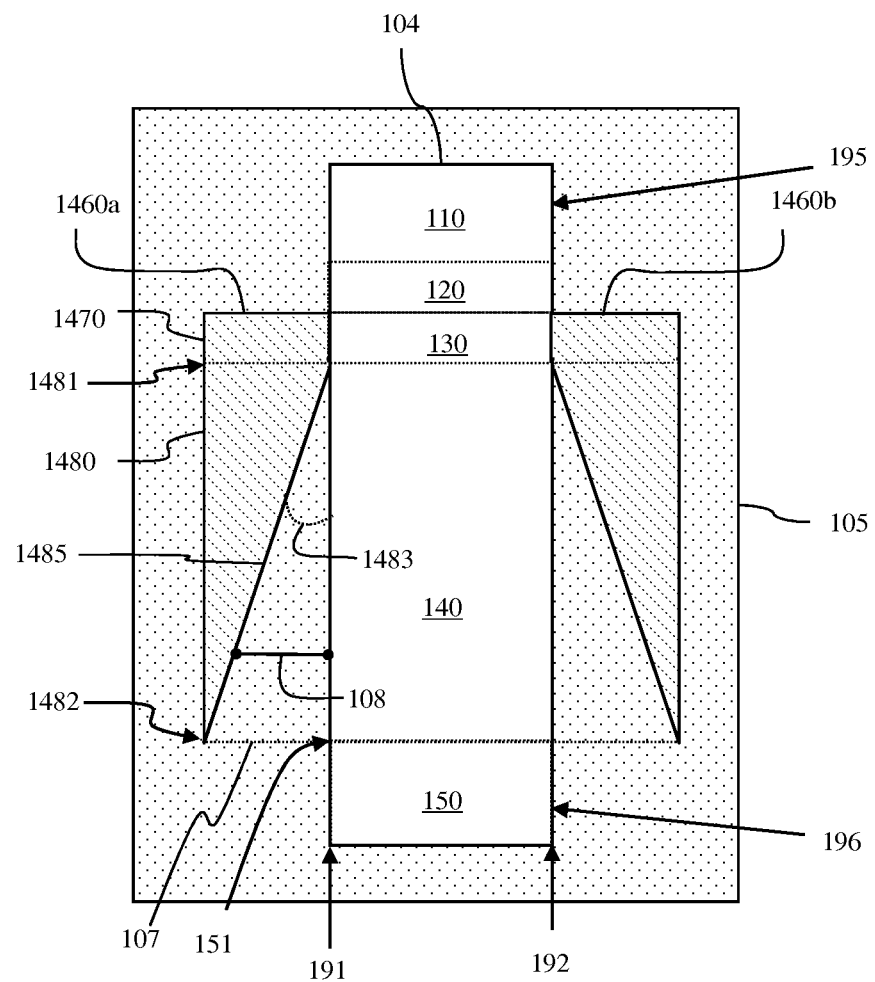
FIG. 16 is a cross-section diagram of a partially completed LEDMOSFET formed according to the technique set forth in FIG. 15.

Referring to FIG. 15, to form such a gate structure 160 for a non-planar, multi-gate, LEDMOSFET 100.1 at process 310 essentially symmetric trenches 1460a-b can be formed on the opposing sides 191 and 192 of the semiconductor body 104 (e.g., using conventional lithographic patterning and etch techniques) (402, see FIG. 16). Each trench 1460a-b can be patterned and etched so as to have a first portion 1470 extending vertically through the trench isolation region 105 (e.g., to the insulator layer 102, in the case of an SOI wafer) (403). This first portion 1470 of each trench 1460a-b can be immediately adjacent to the designated channel region 130 such that the sides 191 and 192 of the semiconductor body 104 at the designated channel region 130 are exposed. Each trench 1460a-b can also be patterned and etched so as to have a second portion 1480 extending vertically through the trench isolation region 105 and extending laterally from the first portion 1470 toward the designated drain region 150 along the designated drain drift region 140 without extending past the junction 151 between the designated drain drift region 140 and the designated drain region 150 (404). Additionally, this second portion 1480 of each trench 1460a-b can be shaped (i.e., tapered) such that the distance between the trench and the designated drain drift region 140 increases from one end 1481 of the second portion 1480 adjacent to the 1$^{st}$ portion 1470 of the trench to another end 1482 of the second portion adjacent to the junction 151 between the designated drain drift region 140 and the designated drain region 150 (404). For example, the second portion 1480 of each trench 1460a-b can be shaped so as to have a linear sidewall 1485, which extends from one end 1481 to the other end 1482 and which is angled (i.e., see angel 1483) relative to the semiconductor body 104 so that the distance between the extension and the designated drain drift region 140 increasing linearly. Thus, each trench 1460a-b leaves in tact a portion 107 of the isolation region 105, which is between the second portion 1480 and the semiconductor body 104 and which has the dimensions defined at processes 304 and, particularly, a continuously increasing width 108 (e.g., a linearly increasing width). Next, a conformal gate dielectric layer (e.g., a gate oxide layer, a high-k gate dielectric layer or other suitable gate dielectric layer) can be formed (e.g., deposited) so as to line the trenches 1460a-b and cover the top surface 193 of the semiconductor body 104 (406). After the gate dielectric layer is formed at process 406, a gate conductor layer (e.g., a metal gate conductor layer, a polysilicon gate conductor layer, a dual work function gate conductor layer or other suitable gate conductor layer) can be formed on the gate dielectric layer (408). The gate dielectric-gate conductor gate stack can then be lithographically patterned and etched to form the gate structure 160 with the main portion 170 and extensions 180, as described above (410, see FIGS. 1-4).

Figure 17:
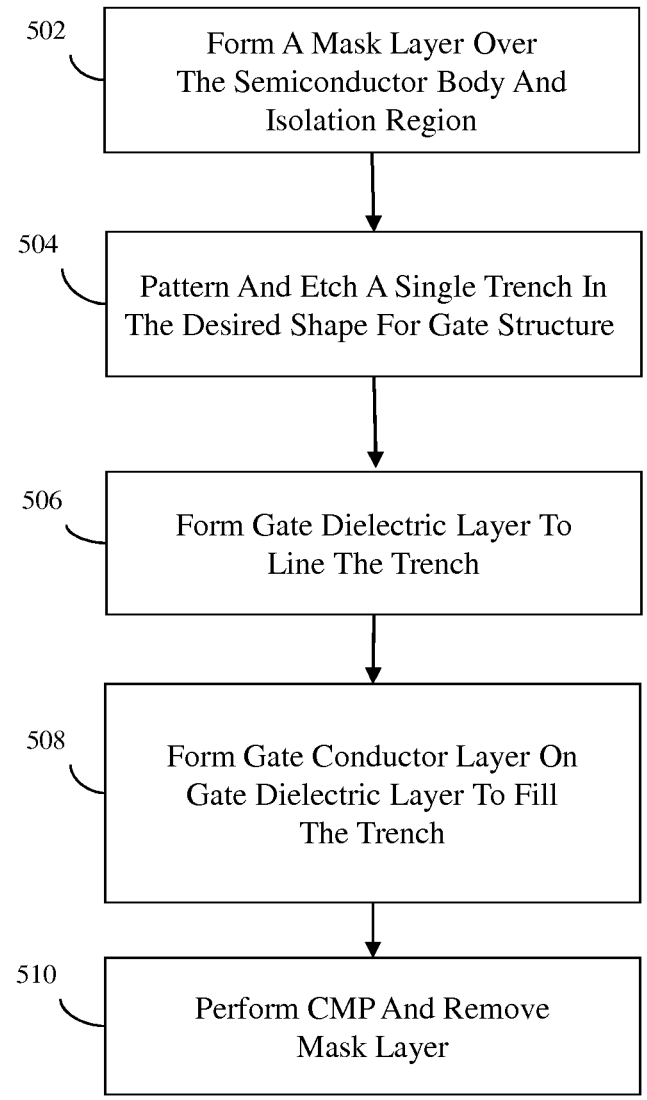
FIG. 17 is a flow diagram illustrating an alternative technique for forming a gate structure at step 310 of FIG. 11.

Those skilled in the art will recognize that other techniques could alternatively be used to form the gate structure 160 at process 310. For example, referring to FIG. 17, a mask layer can be formed over the semiconductor body and over the isolation region that surround the semiconductor body (502). Then, conventional lithographic patterning and etch techniques can be used to form a single trench such that the trench has a first tier that stops on the semiconductor body and a second tier that extends through the isolation region on both sides of the semiconductor body (e.g., to the insulator layer in the case of a SOI wafer). This trench can be patterned and etched so that it has the desired shape of the gate structure, including the main body and extensions, as defined at process 304 (504). Once this trench is etched, a conformal gate dielectric layer (e.g., a gate oxide layer, a high-k gate dielectric layer or other suitable gate dielectric layer) can be formed (e.g., deposited) so as to line the trench (506). After the gate dielectric layer is formed at process 506, a gate conductor layer (e.g., a metal gate conductor layer, a polysilicon gate conductor layer, a dual work function gate conductor layer or other suitable gate conductor layer) can be formed (e.g., deposited) on the gate dielectric layer so as to fill the trench (508). Finally, a chemical mechanical polishing (CMP) process can be formed to expose the mask layer and the mask layer can be removed (510, see FIGS. 1-4).

Referring again to the flow diagram of FIG. 11, for a planar LEDMOSFET 100.2, a gate structure 160 can similarly be formed with a main portion 170 and with extensions 180, as defined at process 304 and illustrated in FIGS. 1-2 and 5-6 (312). Specifically, the gate structure 160 can be formed at process 312 such that it has a main portion 170 adjacent to the designated channel region 130 on the top surface 193 only of the semiconductor body 104. The gate structure 160 can further be formed such that it has extensions 180 positioned adjacent to the designated drain drift region 140. The extensions 180 can be adjacent to the designated drain drift region 140 on both the first and second sides 191-192 of the semiconductor body 104. Each extension 180 can be positioned above (i.e., can sit atop) the isolation region 105 and can extend laterally from the main portion 170 of the gate structure 160 at the designated channel region towards the designated drain region 150 without extending past the junction 151 between the designated drain drift region 140 and the designated drain region 150. Additionally, each extension 180 can have a sidewall 185 (e.g., a linear sidewall) that is angled relative to the semiconductor body 104 such that a portion 107 of the isolation region 105 between the extension 180 and the semiconductor body 104 has the dimensions defined at process 304 and, particularly, has a continuously increasing width 108 (e.g., a linearly increasing width) along the length 144 of the designated drain drift region 140 from the designated channel region 130 to the designated drain region 150. In other words, the each extension 180 of the gate structure is formed such that a portion 107 of the isolation region 105, which remains between the extension 180 and the designated drain drift region 140 and which will function as a dielectric field plate, is tapered along the length 144 of the designated drain drift region 140 from the designated drain region 150 to the designated channel region 130 and has the specific dimensions defined at process 304.

Figure 18:
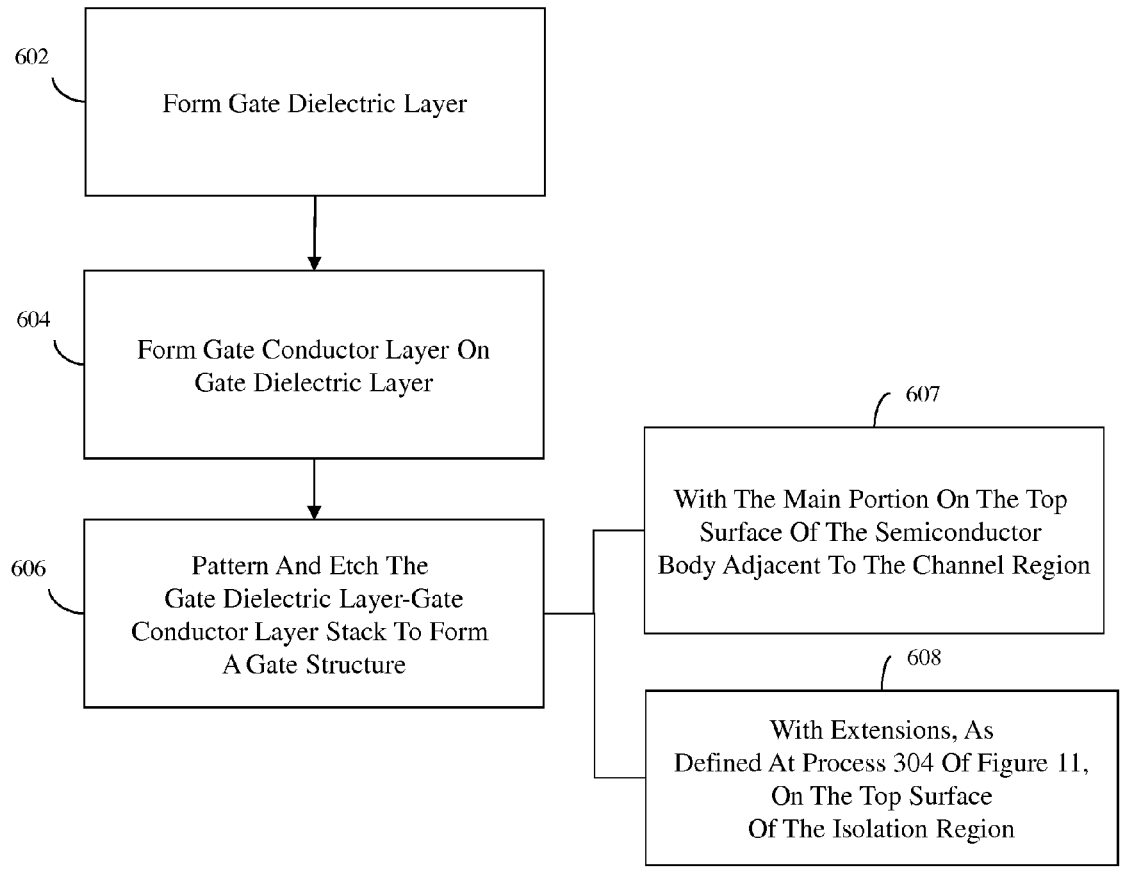
FIG. 18 is a flow diagram illustrating an exemplary technique for forming a gate structure at step 312 of FIG. 11.

Referring to FIG. 18, to form such a gate structure 160 for a planar LEDMOSFET at process 312, a gate dielectric layer (e.g., a gate oxide layer, a high-k gate dielectric layer or other suitable gate dielectric layer) can be formed (e.g., deposited) so as to cover the semiconductor body 104 and the isolation region 105 (602). After the gate dielectric layer is formed at process 602, a gate conductor layer (e.g., a metal gate conductor layer, a polysilicon gate conductor layer, a dual work function gate conductor layer or other suitable gate conductor layer) can be formed on the gate dielectric layer (604). The gate dielectric-gate conductor gate stack can then be lithographically patterned and etched to form the gate structure 160 with the main portion 170 and with the extensions 180 such that a portion 107 of the isolation region 105, as defined at process 304 and described above, remains between the extension 180 and the designated drain drift region 140 to function as a dielectric field plate (606-608, see FIGS. 1-2 and FIGS. 5-6).

The above-described techniques for forming the gate structure 160 for a non-planar multi-gate LEDMOSFET 100.1 at process 310 or for a planar LEDMOSFET 100.2 at process 312 are offered for illustration purposes. It should be understood that any other suitable techniques for forming such gate structures could alternatively be used.

Referring again to the flow diagram of FIG. 11, after the gate structure 160 is formed at process 310 or 312, additional processing steps can be performed in order to complete the LEDMOSFET 100.1 or 100.2, as appropriate (314). These additional steps can include, but are not limited to, gate sidewall spacer formation; multiple dopant implantation processes to form the source halo region 120, the drain drift region 140, and the source and drain regions 110, 150; silicide formation; interlayer dielectric deposition; contact formation, etc. Such additional process steps are well known in the art. Thus, the details of these process steps are omitted from this specification in order to allow the reader to focus on the salient aspects of the embodiments. Additionally, those skilled in the art will recognize that similar method steps to those described above for forming the LEDMOSFET 100.1 can also be used to form the LEDMOSFET 200 of FIGS. 7-10.

The method as described above can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Also disclosed are embodiments of program storage devices (i.e., computer program products) associated with each of the above-described method embodiments and, particularly, process steps 302 and 304 of FIG. 11. The program storage devices can be readable by a computer and can tangibly embody a program of instructions executable by that computer to perform a method of designing any of the LEDMOSFETs, as described above.

Specifically, as will be appreciated by one skilled in the art, some aspects of the disclosed embodiments may be implemented using a computer system or computer program product. Accordingly, some aspects of the disclosed embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, some aspects of the disclosed embodiments may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable program storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable program storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable program storage medium may be any tangible medium (i.e., any non-transitory program storage device) that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the disclosed embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the disclosed embodiments are described above with reference to flowchart illustrations and/or block diagrams of methods, apparatus (systems) and computer program products. It will be understood that steps 302 and 304 of the flowchart in FIG. 11 can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 19:
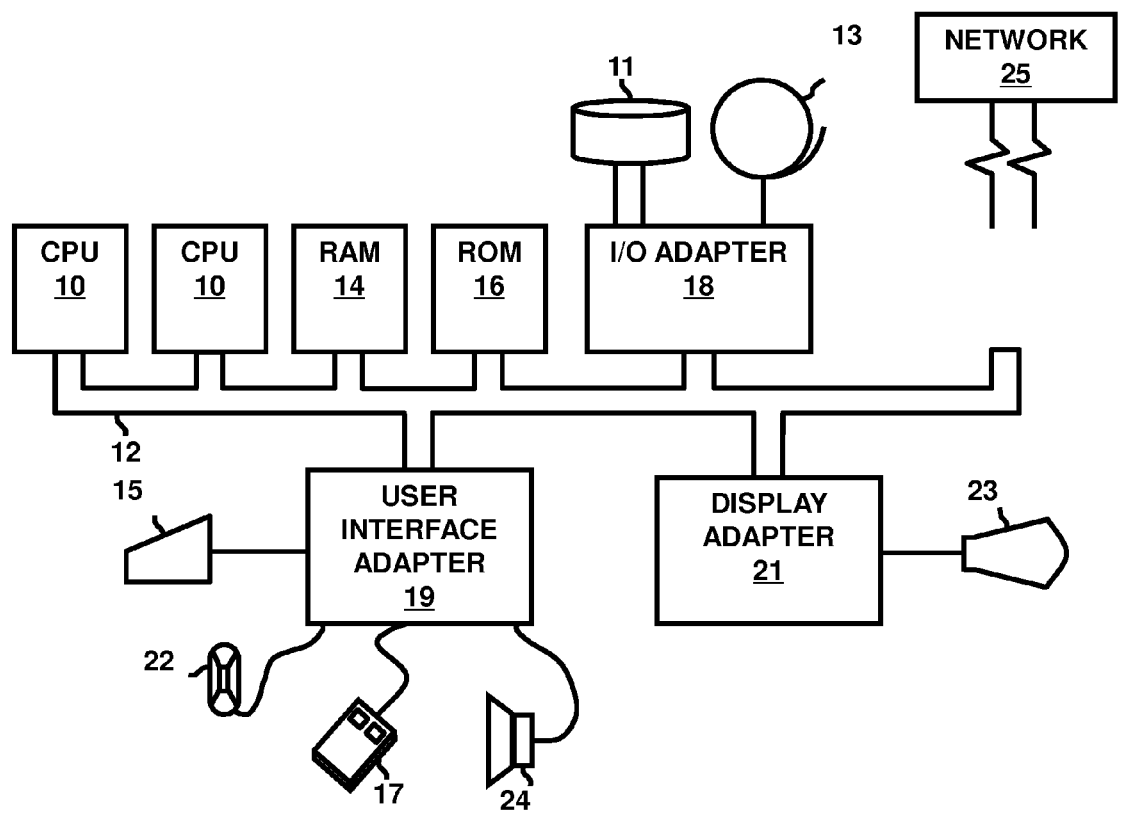
FIG. 19 is a schematic diagram illustrating an exemplary hardware environment that can be used to implement the method embodiments.

A representative hardware environment for practicing the disclosed method embodiments and, particularly, steps 302-304 of FIG. 11 is depicted in FIG. 19. This schematic drawing illustrates a hardware configuration of an information handling/computer system. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the disclosed method embodiments. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The flowchart and block diagrams in the Figures illustrate the architecture, functionality, and operation of possible implementations of the methods and computer program products according to various embodiments disclosed herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Therefore, U.S. application Ser. No. 12/983,439 discloses embodiments of a lateral, extended drain, metal oxide semiconductor, field effect transistor (LEDMOSFET) having a relatively high drain-to-body breakdown voltage (Vb). The LEDMOSFET embodiments have gate structure extensions that are positioned adjacent to opposing sides of the drain drift region and function as conductive field plates. In one embodiment, these extensions extend vertically through the isolation region that surrounds the LEDMOSFET. In another embodiment, the extensions sit atop the isolation region. In either case, each extension has a sidewall that is angled relative to the drain drift region such that the portion of the isolation region between the extension and the drain drift region (i.e., the portion of the isolation region that functions as a dielectric field plate) has a continuously increasing width along the length of the drain drift region from the channel region to the drain region. This dielectric field plate, which is tapered from the drain region to the channel region, creates a strong essentially uniform horizontal electric field profile within the drain drift. Such an electric field profile limits the transverse field to the nwell/pwell junction, limits the ionization rate to safe, low values and allows the drain drift region to be efficiently depleted so that a relatively high specific drain-to-body breakdown voltage to be achieved. U.S. application Ser. No. 12/983,439 also discloses embodiments of an associated method for forming the LEDMOSFET with a specific Vb by defining the dimensions of the extensions and a program storage device for designing the LEDMOSFET to have such a specific Vb.

Newly disclosed herein are additional embodiments of a lateral, extended drain, metal oxide semiconductor, field effect transistor (LEDMOSFET) having a relatively high drain-to-body breakdown voltage (Vb). In these newly disclosed embodiments, rather than being gate structure extensions, the conductive field plates can be, discrete, independently biasable, conductive structures that are isolated from the gate structure. For example, the conductive field plates can comprise discrete polysilicon or metal structures. Alternatively, the conductive field plates can comprise doped regions within the same semiconductor layer as the drain drift region. Furthermore, rather than being tapered dielectric regions, the areas between the conductive field plates and the drain drift region can comprise tapered depletion regions within the same semiconductor layer as the drain drift region. Also disclosed herein are embodiments of a method for forming an LEDMOSFET and embodiments of a silicon-controlled rectifier (SCR) incorporating a pair of complementary LEDMOSFETs.

More particularly, as illustrated in FIGS. 20-25, disclosed herein are additional embodiments of a lateral, extended drain, metal oxide semiconductor, field effect transistor (LEDMOSFET) 700.1, 700.2. LEDMOSFET 700.1, 700.2 comprises essentially the same components as the LEDMOSFET 100.1, 100.2, described in detail above and illustrated in FIGS. 1-6. However, rather than having a gate structure 160 with a main portion 170 and also extensions 180 that function as conductive field plates, as in the LEDMOSFET 100.1, 100.2, the LEDMOSFET 700.1, 700.2 comprises a gate structure 770 adjacent to the channel region 130 and discrete, independently biasable, conductive field plates 780 adjacent to the opposing sides 191-192 of the drain drift region 140 and physically separated from the gate structure 770.

Figures 20, 21:
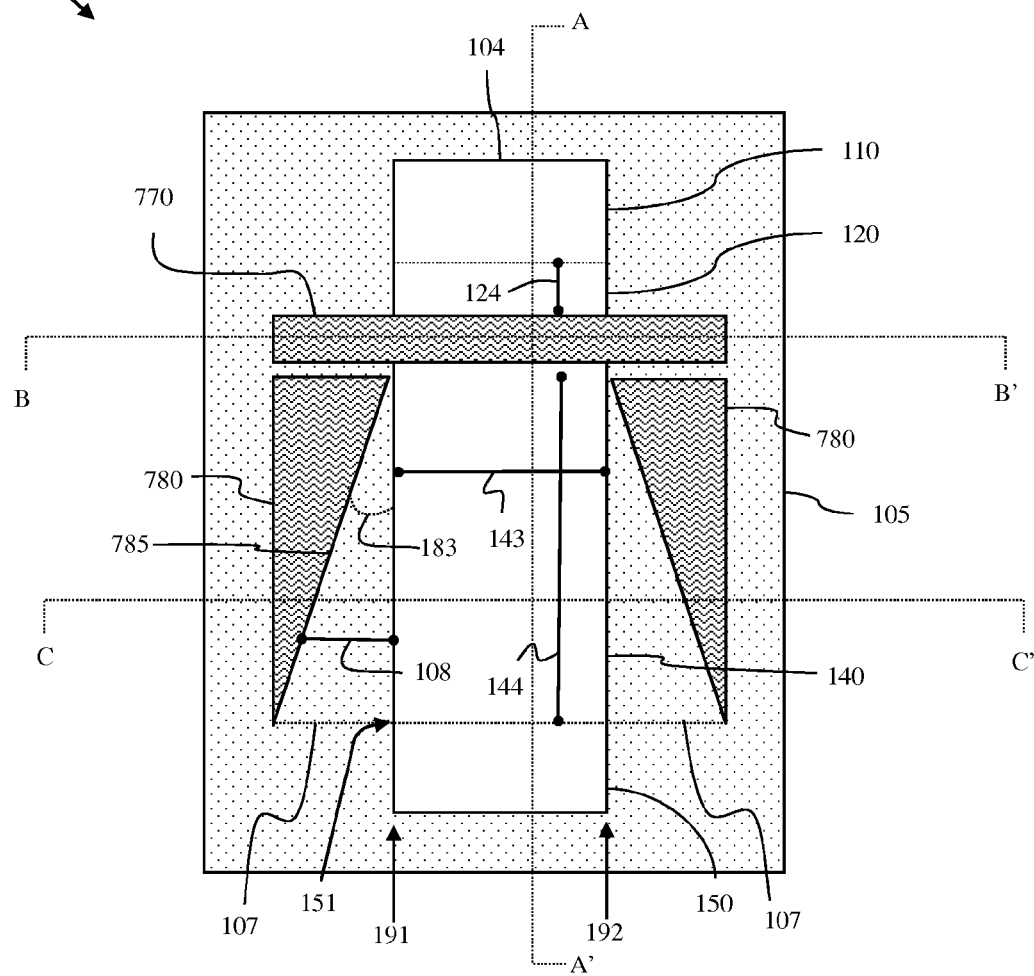
FIG. 20 is a top view illustration of embodiments of yet another LEDMOSFET.
FIG. 21 is a cross-section illustration of the embodiments of the LEDMOSFET of FIG. 20 through a vertical plane A-A' that cuts across the length of the LEDMOSFET.
Figure 22:
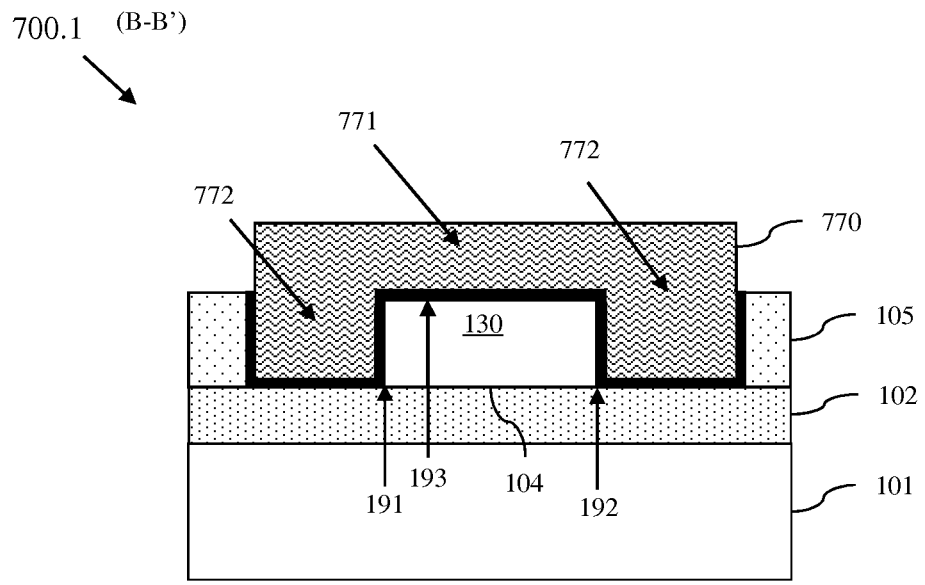
FIG. 22 is a cross-section illustration of an embodiment of a non-planar, multi-gate, LEDMOSFET through a vertical plane B-B', as shown in FIG. 20, that cuts across the width of a channel region of the LEDMOSFET.
Figure 23:
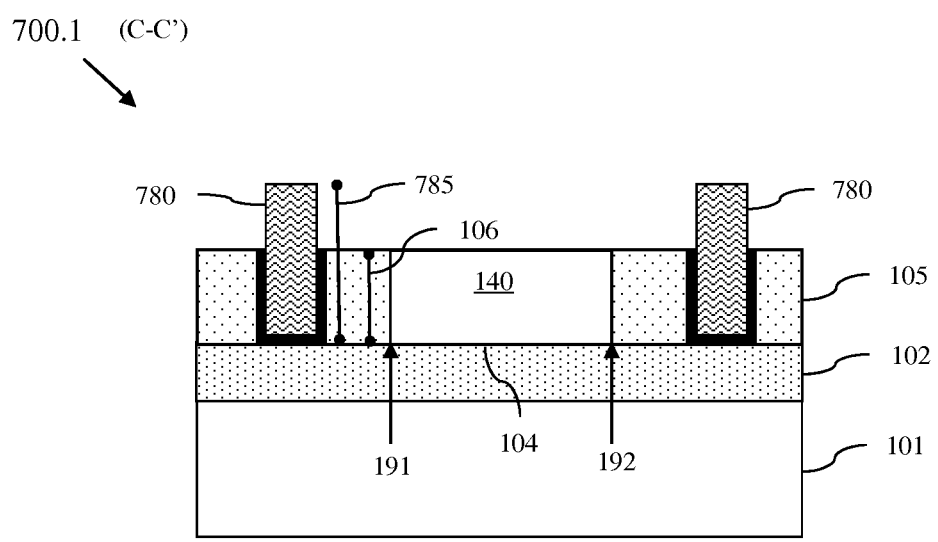
FIG. 23 is another cross-section illustration of the non-planar, multi-gate, LEDMOSFET of FIG. 22 through a vertical plane C-C', as shown in FIG. 20, that cuts across the width of a drain drift region of the LEDMOSFET.
Figure 24:
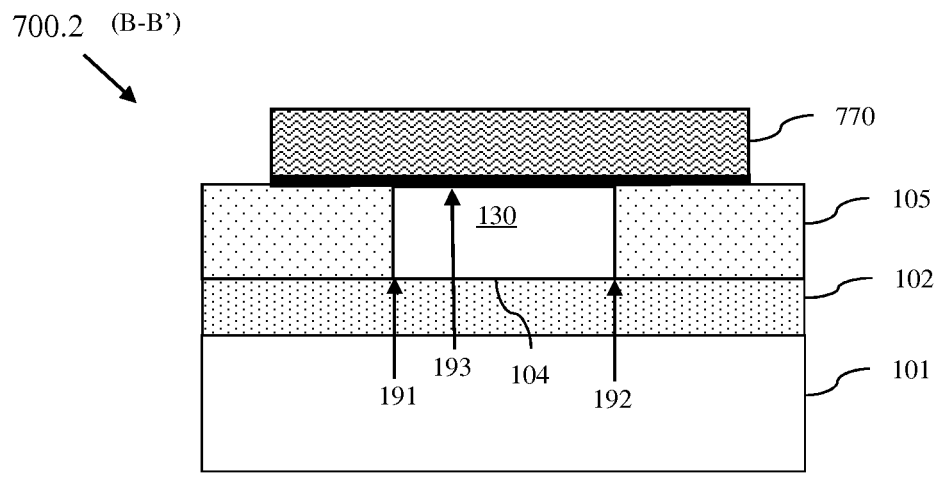
FIG. 24 is a cross-section illustration of an embodiment of a planar LEDMOSFET through a vertical plane B-B', as shown in FIG. 20, that cuts across the width of a channel region of the LEDMOSFET.
Figure 25:
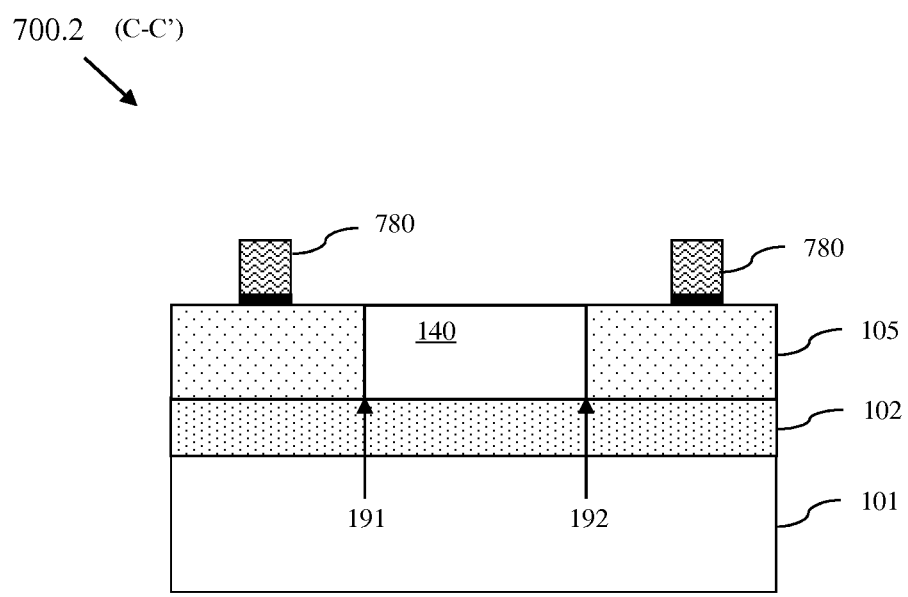
FIG. 25 is another cross-section illustration of the planar LEDMOSFET of FIG. 24 through a vertical plane C-C', as shown in FIG. 20, that cuts across the width of a drain drift region of the LEDMOSFET.

Specifically, LEDMOSFET 700.1 can comprise a non-planar, multi-gate LEDMOSFET and LEDMOSFET 700.2 can comprise a planar LEDMOSFET. FIG. 20 is a top view illustration of both the embodiments 700.1 and 700.2 of the LEDMOSFET. FIG. 21 is a cross-section illustration of the embodiments 700.1 and 700.2 of the LEDMOSFET through a vertical plane that cuts across the length of the device (i.e., through the plane A-A' as shown in FIG. 20). FIG. 22 is a cross-section illustration of the embodiment 700.1 of the LEDMOSFET (i.e., the non-planar, multi-gate, LEDMOSFET) through a vertical plane that cuts across the width of the channel region 130 of the device (i.e., through the plane B-B' as shown in FIG. 20). FIG. 23 is another cross-section illustration of the embodiment 700.1 of the LEDMOSFET through a vertical plane that cuts across the width of the drain drift region 140 of the device (i.e., through the plane C-C' as shown in FIG. 20). FIG. 24 is a cross-section illustration of the embodiment 700.2 of the LEDMOSFET (i.e., the planar LEDMOSFET) through a vertical plane that cuts across the width of the channel region 130 of the device (i.e., through the plane B-B' as shown in FIG. 20). FIG. 25 is another cross-section illustration of the embodiment 700.2 of the LEDMOSFET through a vertical plane that cuts across the width of the drain drift region 140 of the device (i.e., through the plane C-C' as shown in FIG. 20).

The conductive field plates 780 can be physically separated and electrically isolated from the gate structure 770. Each conductive field plate 780 can have a sidewall 785 that is angled (e.g., see angle 783) relative to the drain drift region 140 such that the area between the drain drift region 140 and the conductive field plate 780 has a continuously increasing width 108 along the length 144 of the drain drift region 140 from adjacent the channel region 130 to adjacent the drain region 150. The conductive field plates 780 can comprise discrete doped polysilicon structures that are patterned, for example, from the conductive material (e.g., doped polysilicon or metal) used to form the gate structure 770. Alternatively, the conductive field plates 780 can comprise different conductive material(s) than that used to form the gate structure 770.

In either case, as in the previously disclosed LEDMOSFET 100.1, 100.2, the areas between the drain drift region 140 and the conductive field plates 780 can comprise tapered portions of a trench isolation region 105 that extends vertically through the semiconductor layer adjacent to the drain drift region 140 (i.e., can comprise tapered dielectric regions 107). These tapered dielectric regions 107 can increase the drain-to-body breakdown voltage (Vb) of the LEDMOSFET (e.g., up to or over 40 volts) so that the LEDMOSFET 700.1, 700.2 has a specific Vb is suitable for high voltage applications (e.g., switch or micro-electronic mechanical (MEMS) applications). Specifically, using essentially the same formula discussed in detail above with regard to the LEDMOSFET 100.1, 100.2, the dimensions of the tapered dielectric regions 107 as well as the dimensions of the conductive field plates can be predefined so as to create a strong uniform horizontal electric field profile within the drain drift region 140 of the semiconductor body 104 (i.e., from the channel region 130 to the drain region 150). This strong uniform electric field profile limits the transverse field to the nwell/pwell junction, limits the ionization rate to a safe, low values and allows the drain drift region 140 to be efficiently depleted so that a specific relatively high drain-to-body breakdown voltage (e.g., Vb=15-50 volts) can be achieved.

Those skilled in the art will recognize that, like the other non-planar, multi-gate LEDMOSFET embodiments disclosed herein, the effective channel width and, thereby the drive current of the embodiment 700.1, described above, can be increased by incorporating multiple semiconductor fingers (i.e., semiconductor fins) into the structure. In this case, each semiconductor fin can comprise a drain drift region flanked by tapered dielectric regions and discrete conductive field plates.

Figure 26:
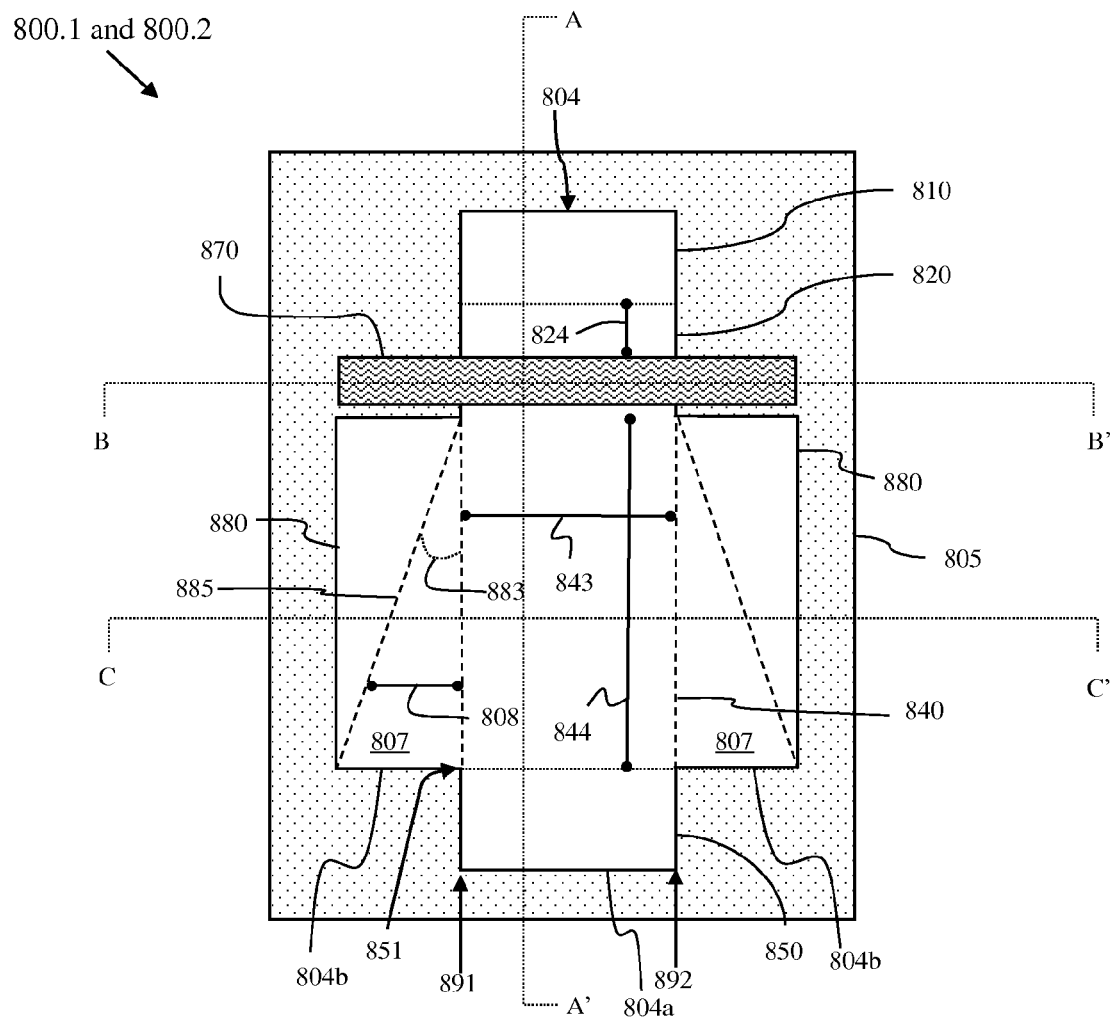
FIG. 26 is a top view illustration of embodiments of yet another LEDMOSFET.
Figure 27:
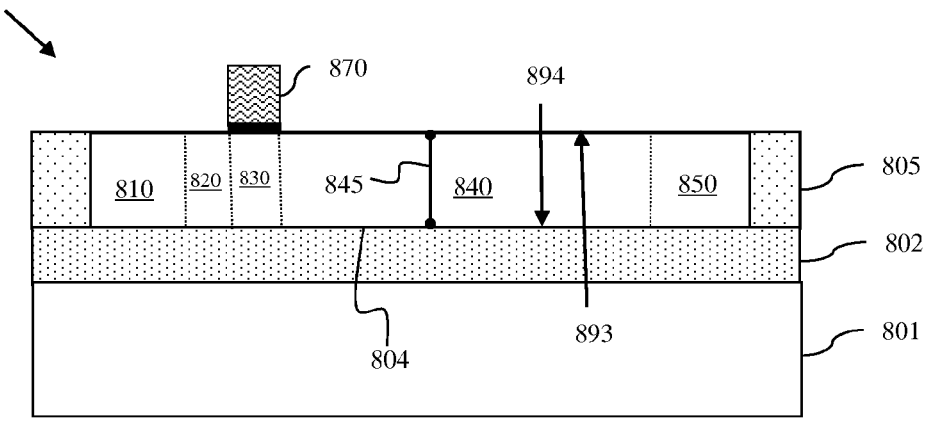
FIG. 27 is a cross-section illustration of the embodiments of the LEDMOSFET of FIG. 26 through a vertical plane A-A' that cuts across the length of the LEDMOSFET.
Figure 28:
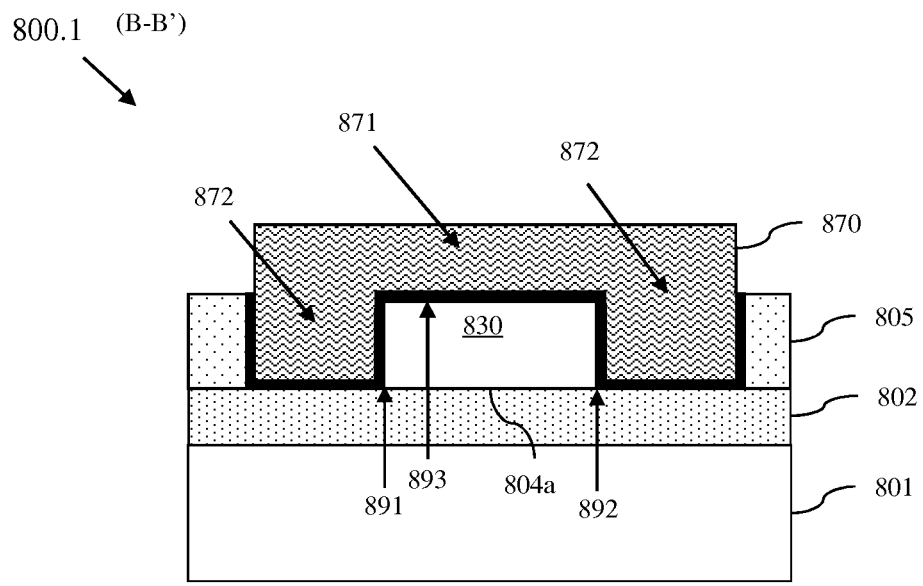
FIG. 28 is a cross-section illustration of an embodiment of a non-planar, multi-gate, LEDMOSFET through a vertical plane B-B', as shown in FIG. 26, that cuts across the width of a channel region of the LEDMOSFET.
Figure 29:
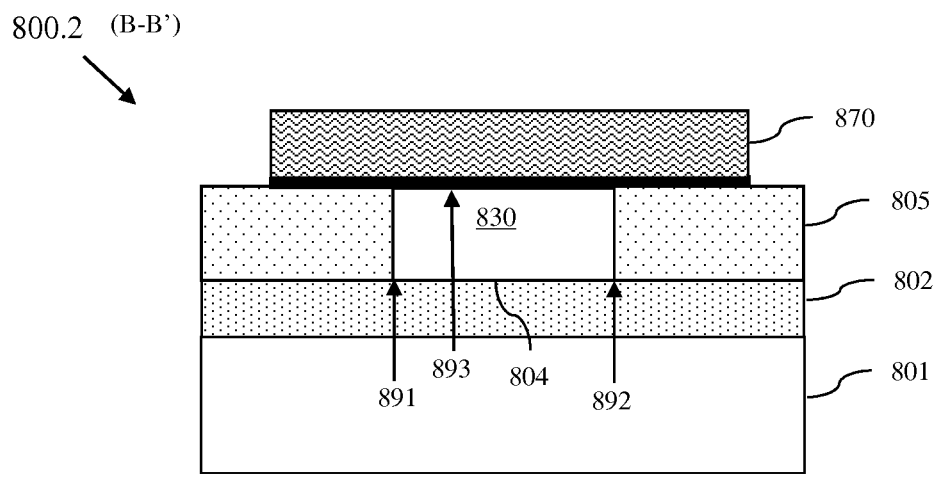
FIG. 29 is a cross-section illustration of an embodiment of a planar LEDMOSFET through a vertical plane B-B', as shown in FIG. 26, that cuts across the width of a channel region of the LEDMOSFET.
Figure 30:
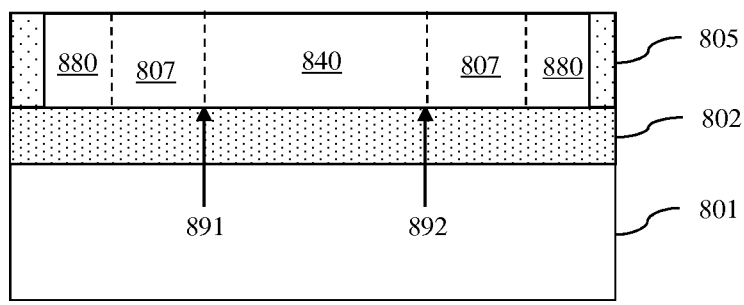
FIG. 30 is cross-section illustration of the embodiments of the LEDMOSFET of FIG. 26 through a vertical plane C-C' that cuts across the width of a drain drift region of the LEDMOSFET.

Also disclosed herein are additional embodiments of a lateral, extended drain, metal oxide semiconductor, field effect transistor (LEDMOSFET) 800.1, 800.2, as illustrated in FIGS. 26-30. LEDMOSFET 800.1 can comprise a non-planar, multi-gate LEDMOSFET and LEDMOSFET 800.2 can comprise a planar LEDMOSFET. Specifically, FIG. 26 is a top view illustration of both the embodiments 800.1 and 800.2 of the LEDMOSFET. FIG. 27 is a cross-section illustration of the embodiments 800.1 and 800.2 of the LEDMOSFET through a vertical plane that cuts across the length of the device (i.e., through the plane A-A' as shown in FIG. 26). FIG. 28 is a cross-section illustration of the embodiment 800.1 of the LEDMOSFET (i.e., the non-planar, multi-gate, LEDMOSFET) through a vertical plane that cuts across the width of the channel region 830 of the device (i.e., through the plane B-B' as shown in FIG. 26). FIG. 29 is a cross-section illustration of the embodiment 800.2 of the LEDMOSFET (i.e., the planar LEDMOSFET) through a vertical plane that cuts across the width of the channel region 830 of the device (i.e., through the plane B-B' as shown in FIG. 26). FIG. 30 is cross-section illustration of the embodiments 800.1 and 800.2 of the LEDMOSFET through a vertical plane that cuts across the width of the drain drift region 840 of the device (i.e., through the plane C-C' as shown in FIG. 26).

Referring to FIGS. 26 and 27 in combination, LEDMOSFET 800.1, 800.2 can comprise a semiconductor body 804. This semiconductor body 804 can be essentially cross-shaped. That is, it can comprise a main portion 804a that is essentially rectangular in shape and additional portions 804b, which are also essentially rectangular in shape and which extend laterally from opposing sides 891, 892 of the main portion 804a. An isolation region 805 can be positioned laterally around the semiconductor body 804 (i.e., can define the shape of the semiconductor body 804).

Specifically, this semiconductor body 804 can comprise a portion of a semiconductor layer of a semiconductor-on-insulator (SOI) wafer. Such an SOI wafer can comprise a semiconductor substrate 801 (e.g., a silicon substrate or other semiconductor substrate), an insulator layer 802 (e.g., a silicon oxide layer or other suitable insulator layer) on the substrate 802 and a semiconductor layer (e.g., a single crystalline silicon layer, a single crystalline gallium nitride layer or other suitable semiconductor layer) on the insulator layer 802. The portion of the semiconductor layer that makes up the semiconductor body 804 can be defined, for example, by a trench isolation region 805. This trench isolation region 805 can, for example, comprise a conventional shallow trench isolation (STI) structure comprising a trench extending vertically through the semiconductor layer to the insulator layer 802 and filled with one or more isolation materials (e.g., a silicon oxide, silicon nitride, silicon oxynitride, etc.). Alternatively, the semiconductor body 804 of the embodiments 800.1 and 800.2 can comprise a portion, as defined by a trench isolation region 805, of a bulk semiconductor wafer (e.g., a single crystalline silicon wafer) or any other suitable wafer (e.g., a hybrid orientation (HOT) wafer) (not shown).

In any case, the main portion 804a of the semiconductor body 804 can comprise the various doped regions (i.e., dopant implant regions) typically found in an LEDMOSFET in order to minimize short channel effects and still achieve a relatively fast switching speed. For example, the main portion 804a of the semiconductor body 804 can comprise a channel region 830 having a first conductivity type and source and drain regions 810, 850, having a second conductivity type different from the first conductivity type, on opposite sides of the channel region 830. Optionally, a halo region 820 and/or a source drift region (not shown) can be positioned laterally between the source region 810 and the channel region 830. The halo region 820 can have the same conductivity type as the channel region 830, but can be doped at a higher concentration so as to reduce short channel effects (e.g., increase threshold voltage (Vt), reduce punch through, etc.). The source drift region can have the same conductivity type as the source region 810, but can be doped at a lesser concentration. A drain drift region 840, but not a halo region, can be positioned laterally between the channel region 830 and the drain region 850. The drain drift region 840 can be relatively long such that the distance 844 between the channel region 830 and the drain region 850 is longer than the distance 824 between the channel region 830 and the source region 810. The drain drift region 840 can also have the same conductivity type as the drain region 810, but can be doped at a lesser concentration.

Thus, the LEDMOSFET 800.1, 800.2 can be asymmetric with respect to the source/drain extension/drift region configuration and, optionally, with respect to the source/drain halo region configuration. Such an LEDMOSFET provides decreased source resistance, increased threshold voltage, decreased off current (Ioff), increased leakage at the source-to-body junction, decreased leakage at the drain-to-body junction, decreased drain-to-gate capacitance and decreased drain-to-body capacitance and, thereby limits short channel effects without decreasing switching speed.

The LEDMOSFET 800.1, 800.2 can further comprise a gate structure 870 positioned adjacent to the channel region 830. The gate structure 870 can comprise a gate dielectric layer (e.g., a gate oxide layer, a high-k gate dielectric layer or other suitable gate dielectric layer) and a gate conductor layer (e.g., a polysilicon gate conductor layer, a metal gate conductor layer, a dual work function gate conductor layer or other suitable gate conductor layer) on the gate dielectric layer. Referring to FIG. 28 in combination with FIGS. 26-27, in the case of a non-planar, multi-gate LEDMOSFET 800.1, the gate structure 870 can have a horizontal section 861 positioned adjacent to (i.e., traversing) the channel region 830 on the top surface 893 of the main portion 804a of the semiconductor body. The gate structure 870 can also have vertical sections 862 positioned adjacent to the channel region 830 on the first and second sides 891-192 of the main portion 804a of the semiconductor body (i.e., extending vertically through the isolation region 805, for example, to the insulator layer 802 in the case of an SOI wafer). Alternatively, referring to FIG. 29 in combination with FIGS. 26-27, in the case of a planar LEDMOSFET 800.2, the gate structure 870 can be positioned adjacent to (i.e., can traverse) the channel region 830 on the top surface 893 only of the main portion 804a of semiconductor body.

The drain drift region 840 can be aligned between the additional portions 804b of the semiconductor body and can further have essentially the same length 844 as the additional portions 804b of the semiconductor body. Each of the additional portions 804b can comprise an additional doped region (i.e., an additional dopant implant region), which functions as a conductive field plate 880 and which is separated from the drain drift region 840 by a tapered depletion region 807 to increase the drain-to-body breakdown voltage (Vb) (e.g., up to or over 40 volts) so that the LEDMOSFET 800.1, 800.2 is suitable for high voltage applications (e.g., switch or microelectronic mechanical (MEMS) applications).

Specifically, each additional portion 804b can comprise a conductive field plate 880 and a tapered depletion region 870. Each conductive field plate 880 can comprise a doped region (i.e., a dopant implant region) with a relatively high conductivity and the same conductivity type as the channel region 830 (e.g., the first conductivity type). That is, each conductive field plate 880 can have a different conductivity type than the source and drain regions 810, 850. Each conductive field plate 880 can further have a sidewall 885 (e.g., a linear sidewall), also referred to as an implant region edge, that is angled relative to drain drift region 840 in the main portion 804a of the semiconductor body such that the area of the additional portion 804b, which is between the conductive field plate 880 and drain drift region 840, has a continuously increasing width 808 (e.g., a linearly increasing width) along the length 844 of the drain drift region 840 from adjacent the channel region 830 to adjacent the drain region 850. Thus, this area between the angled sidewall 885 of the conductive field plate 880 and the drain drift region 840 is tapered from adjacent the drain region 850 to adjacent the channel region 830. This tapered area can be either undoped or low-doped (e.g., it can have the same conductivity type and level as the channel region 830) such that it can function as a tapered depletion region 807. Like the tapered dielectric field plates in the previously disclosed embodiments, such tapered depletion regions can also create a strong uniform horizontal electric field profile within the drain drift region 840 from adjacent the channel region 830 to adjacent the drain region 850. This strong uniform electric field profile limits the transverse field to the nwell/pwell junction, limits the ionization rate to a safe, low values and allows the drain drift region to be efficiently depleted so that a specific relatively high drain-to-body breakdown voltage (e.g., Vb=15-50 volts) can be achieved.

It should be noted that the dimensions of the area between the drain drift region and each conductive field plate (i.e., the dimensions of the tapered depletion regions 807) including, but not limited to, the length and maximum width of the tapered depletion regions 807 and, thereby, the dimensions of the conductive field plates 880 including, but not limited to, the angle 883 at which the sidewall 885 is positioned relative to the drain drift region 840 and the length of the sidewall 885 are predefined based on the dimensions and doping profile of the drain drift region 840 so that the LEDMOSFET has a specific drain-to-body breakdown voltage (Vb) (see detailed discussion below with regard to the method embodiments).

Those skilled in the art will recognize that, like the other non-planar, multi-gate LEDMOSFET embodiments disclosed herein, the effective channel width and, thereby the drive current of the embodiment 800.1, described above, can be increased by incorporating multiple semiconductor fingers (i.e., semiconductor fins) into the structure. In this case, each semiconductor fin can comprise a drain drift region flanked by tapered depletion regions and discrete conductive field plates.

Also disclosed herein are method embodiments for designing and forming a lateral, extended drain, metal oxide semiconductor, field effect transistor (LEDMOSFET) having a relatively high drain-to-body breakdown voltage (Vb), such as the LEDMOSFET 700.1, 700.2 of FIGS. 20-25 or the LEDMOSFET 800.1, 800.2 of FIGS. 26-30.

Figure 31:
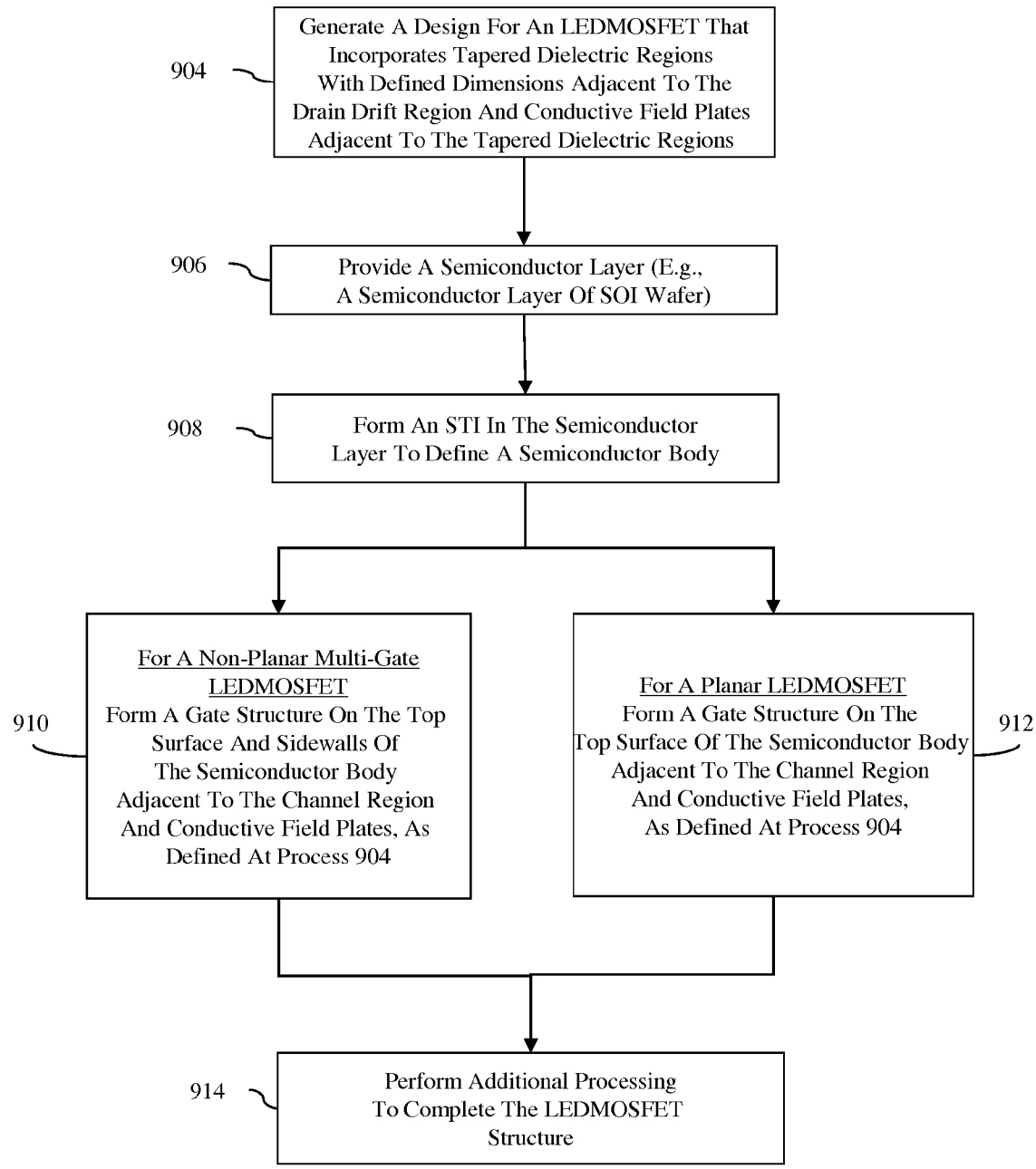
FIG. 31 is a flow diagram illustrating embodiments of a method of forming the embodiments of the LEDMOSFET shown in FIG. 20.

To design and form the LEDMOSFET 700.1, 700.2, the process steps set forth in the flow diagram of FIG. 31 can be performed. It should be noted that these process steps are essentially the same as those used to design and form the LEDMOSFET 100.1, 100.2, as set forth in the flow diagram of FIG. 11 and the detailed discussion above. However, according to the process steps set forth in FIG. 31, discrete, independently biasable, conductive field plates 780 can be incorporated into the LEDMOSFET design and formed, rather than gate structure extensions 180, which function as conductive field plates and which are incorporated into the LEDMOSFET design and formed according to the process steps of FIG. 11.

Specifically, referring to the flow diagram of FIG. 31, a design for an LEDMOSFET 700.1, 700.2 can be generated that incorporates conductive field plates 780 and tapered dielectric regions 107 adjacent to the opposing sides 191, 192 of the drain drift region 140 in order to increase the drain-to-body breakdown voltage (Vb) of the LEDMOSFET to a specific level (e.g., 15, volts, 20 volts, 30 volts, 40 volts, 50 volts etc.) (304). The generated design can be for an entirely new LEDMOSFET or for an LEDMOSFET altered to include the conductive field plates and tapered dielectric regions.

Like the gate structure extensions 180 of the LEDMOSFET 100.1, the conductive field plates 780 of the LEDMOS- FET 700.1, as shown in FIGS. 20 and 23, can be incorporated into this design at process 904 such that each conductive field plate 780 extends vertically through the isolation region 105 (e.g., to an insulator layer 102) and such that each conductive field plate 780 further extends laterally from adjacent the gate structure 770 toward the drain region 150. Similarly, like the gate structure extensions 180 of the LEDMOSFET 100.2, the conductive field plates 780 of the LEDMOSFET 700.2, as shown in FIGS. 20 and 25, can be incorporated into this design at process 904 such that each conductive field plate 780 sits on the top surface of the isolation region 105 and such that each conductive field plate 780 further extends laterally from adjacent the gate structure 770 toward the drain region 150.

In either case, as shown in FIG. 20, the conductive field plates 780 can be incorporated into the design at process 904 such that each conductive field plate 780 has a sidewall 785 (e.g., a linear sidewall) that is angled (e.g., see angle 783) relative to the semiconductor body 104 and, thereby such that a portion 107 of the isolation region 105 between the conductive field plate 780 and the semiconductor body 104 will have a continuously increasing width 108 (e.g., a linearly increasing width) along the length 144 of the drain drift region 140 from adjacent the channel region 130 to adjacent the drain region 150. In other words, by design, the portion 107 of the isolation region 105, which will be between the conductive field plate 780 and the drain drift region 140 and which will function as a dielectric field plate, will be tapered along the length 144 of the drain drift region 140 from the drain region 150 to the channel region 130. It should be noted that the dimensions of tapered dielectric regions 107 and, thereby the conductive field plates 780, can be determined (i.e., defined, calculated) using the same formula discussed in detail above with regard process step 304 of FIG. 11.

Once the design is generated at process 904 and the dimensions of the conductive field plates 780 and tapered dielectric regions 107 are defined, the LEDMOSFET 700.1, 700.2 can be formed. Specifically, a semiconductor layer can be provided (906) and a trench isolation region 105 can be formed in the semiconductor layer so as to define a semiconductor body 104 (908, see FIGS. 14A-14B). It should be noted that the process steps 906-908 are essentially the same at the process steps 306-308 of FIG. 11, described in detail above.

Next, a gate structure 770 and conductive field plates 780 can be formed, as defined at process 904 (910-912).

To form the gate structure 770 and conductive field plates 780 at process 910, for a non-planar, multi-gate, LEDMOSFET 700.1, steps similar to those described above with regard to process 310 of FIG. 11 can be used. For example, rather than forming a single trench with a first portion and a second portion on each side of the semiconductor body form forming the vertical portions of a gate structure and gate structure extensions, respectively, a first trench and a second trench can be formed on each side of the semiconductor body for forming vertical portions of the gate structure and discrete conductive field plates, respectively. Next, a conformal gate dielectric layer (e.g., a gate oxide layer, a high-k gate dielectric layer or other suitable gate dielectric layer) can be formed (e.g., deposited) so as to line the trenches and cover the top surface of the semiconductor body. After the gate dielectric layer is formed, a gate conductor layer (e.g., a metal gate conductor layer, a polysilicon gate conductor layer, a dual work function gate conductor layer or other suitable gate conductor layer) can be formed on the gate dielectric layer. The gate dielectric-gate conductor gate stack can then be lithographically patterned and etched to form the gate structure 770 and the discrete conductive field plates 780, as described above (see FIGS. 20-23), rather than a gate structure with extensions.

Alternatively, to form the gate structure 770 and conductive field plates 780 at process 912, for a planar LEDMOSFET 700.2, steps similar to those described above with regard to process 312 of FIG. 11 can be used. For example, a gate dielectric layer (e.g., a gate oxide layer, a high-k gate dielectric layer or other suitable gate dielectric layer) can be formed (e.g., deposited) so as to cover the semiconductor body and the isolation region. After the gate dielectric layer is formed, a gate conductor layer (e.g., a metal gate conductor layer, a polysilicon gate conductor layer, a dual work function gate conductor layer or other suitable gate conductor layer) can be formed on the gate dielectric layer. The gate dielectric-gate conductor gate stack can then be lithographically patterned and etched to form the gate structure 770 and discrete conductive field plates 780 (e.g., discrete polysilicon or metal structures) as described above (see FIGS. 20-21 and 24-25), rather than a gate structure with extensions.

The above-described techniques for forming the gate structure 770 and discrete conductive field plates for the LEDMOSFET 700.1, 700.2 at processes 910, 912 are offered for illustration purposes. It should be understood that any other suitable techniques for forming such gate structures and discrete conductive field plates could alternatively be used.

Referring again to the flow diagram of FIG. 31, after the gate structure 770 and discrete conductive field plates 780 are formed at process 910 or 912, additional processing steps can be performed in order to complete the LEDMOSFET 700.1, 700.2, as appropriate (914). These additional steps can include, but are not limited to, gate sidewall spacer formation; dopant implantation processes to provide the required doping for the source halo region 120, the drain drift region 140, and the source and drain regions 110, 150, etc. if not previously performed; silicide formation; interlayer dielectric deposition; contact formation, etc. Such additional process steps are well known in the art. Thus, the details of these process steps are omitted form this specification in order to allow the reader to focus on the salient aspects of the disclosed embodiments.

Those skilled in the art will recognize that similar method steps to those described above and illustrated in FIG. 31 for designing and forming the LEDMOSFET 700.1 can also be used to form an LEDMOSFET having multiple semiconductor fingers (i.e., semiconductor fins) for increased channel width and, thereby drive current. In this case, each semiconductor fin would comprise a drain drift region flanked by tapered depletion regions and discrete conductive field plates.

Figure 32:
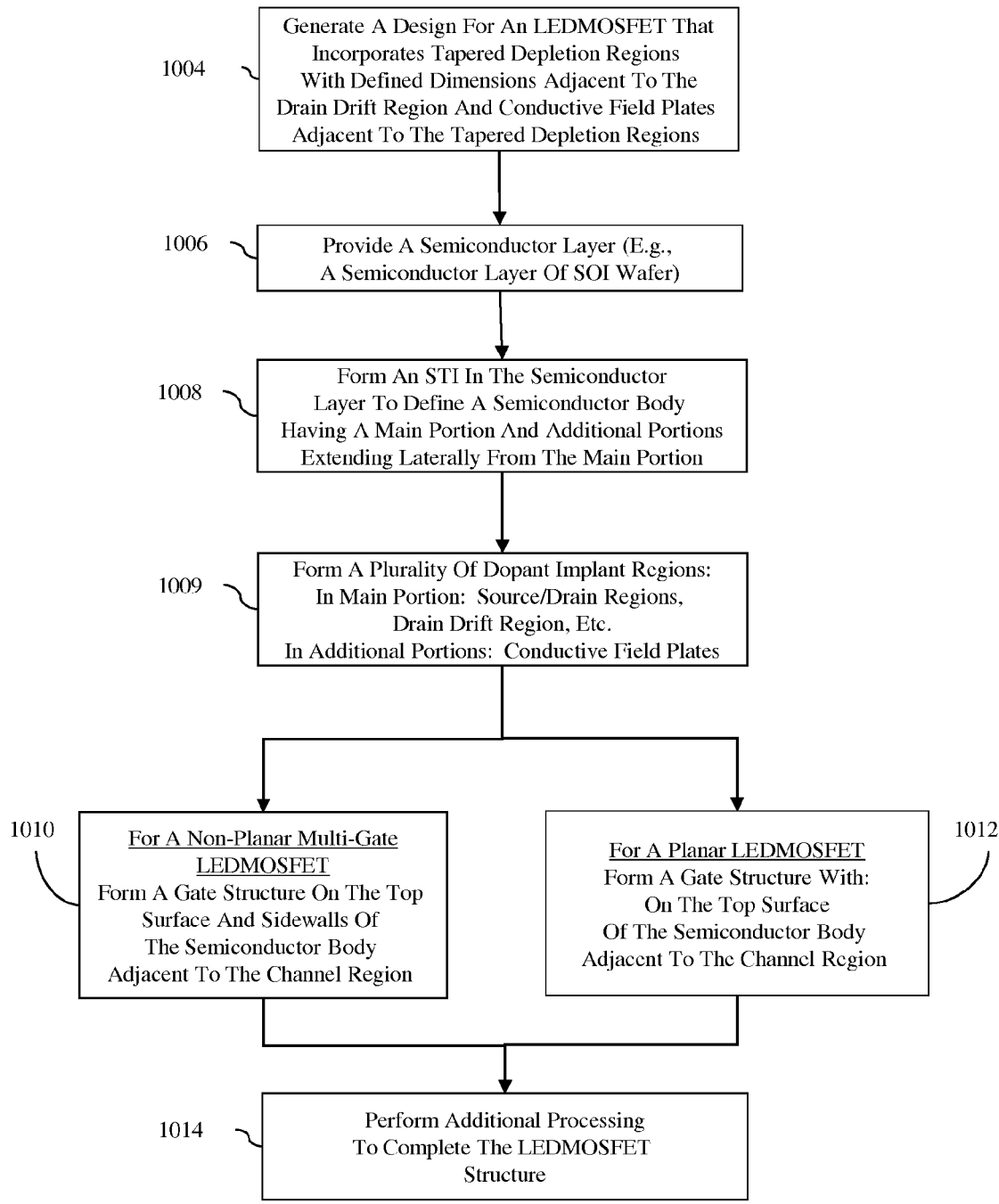
FIG. 32 is a flow diagram illustrating embodiments of a method of forming the embodiments of the LEDMOSFET shown in FIG. 26.
Figure 33:
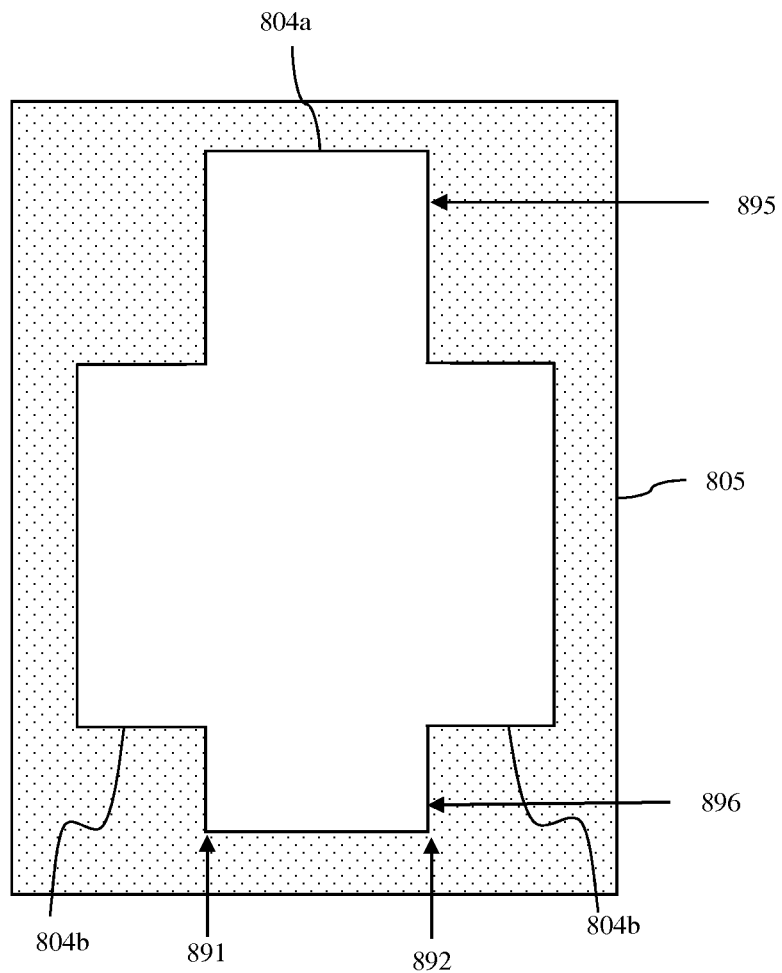
FIG. 33 is a cross-section diagram of a partially completed LEDMOSFET formed according to the method of FIG. 32.

To design and form the LEDMOSFET 800.1, 800.2, the process steps set forth in the flow diagram of FIG. 32 can be used. Specifically, a design for an LEDMOSFET 800.1, 800.2 can be generated that incorporates discrete conductive field plates 880 and tapered depletion regions 807 adjacent to the opposing sides of the drain drift region 840 in order to increase the drain-to-body breakdown voltage (Vb) of the LEDMOSFET to a specific level (e.g., 15, volts, 20 volts, 30 volts, 40 volts, 50 volts etc.) (1004). The generated design can be for an entirely new LEDMOSFET or for an LEDMOSFET altered to include the conductive field plates and tapered depletion regions.

The generated design can comprise a semiconductor body 804 comprising a main portion 804a that is essentially rectangular in shape and additional portions 804b, which are also essentially rectangular in shape and which extend laterally from the opposing sides 891, 892 of the main portion 804a. The main portion 804b can comprise various doped regions (i.e., dopant implant regions) comprising at least a source region 810, a channel region 830, a drain drift region 840 and a drain region 850. Each additional portion 804b can comprise a conductive field plate 880 and a depletion region 807. The conductive field plates 880 can comprise doped regions (i.e., dopant implant regions). Each conductive field plate 880 can further have a sidewall 885 (e.g., a linear sidewall), also referred to as an implant region edge, that is angled relative to the main portion 804a of the semiconductor body such that the remaining area of the additional portion 804b between the conductive field plate 880 and drain drift region 840 has a continuously increasing width 808 (e.g., a linearly increasing width) along the length 844 of the drain drift region 840 from adjacent the channel region 830 to adjacent the drain region 850. Thus, the area between the conductive field plate 880 and the drain drift region 840 is tapered from adjacent the drain region 350 to adjacent the channel region. Additionally, this area can be either undoped or low-doped such that it can function as a tapered depletion region 807.

The process 1004 of incorporating such conductive field plates 880 and tapered depletion regions 807 into a design for an LEDMOSFET can comprise predefining (i.e., predetermining) the dimensions of the additional portions 804b of the semiconductor body and of each conductive field plate 880 and tapered depletion region 807 to be contained therein. For example, this process can include, but is not limited to, defining the taper angle and maximum width of the tapered depletion region 807 and, thereby the angle 883 at which the sidewall 885 of each conductive field plate 880 will be positioned relative to the drain drift region 840, the length of the sidewall 885, etc. The dimensions can specifically be defined (i.e., determined, calculated, etc.) based on the specifications set out in the design for the drain drift region 840 in order to form an LEDMOSFET 800.1, 800.2 that will have an essentially uniform horizontal electric field profile within the drain drift region 840 and a specific drain-to-body breakdown voltage (Vb). These specifications can include, but are not limited to, the desired width 843 of the drain drift region 840 from the first side 891 to the second side 892 of the main portion 804a of the semiconductor body, the desired length 844 of the drain drift region 140 from the channel region 830 to the drain region 850, the desired height 845 for the drain drift region 840 (e.g., as measured from the top surface an insulator layer below, in the case an SOI device) and the desired doping profile for the drain drift region 840

It should be noted that the embodiments disclosed herein allow essentially the same relatively strong horizontal electric field profile to achieve in both non-planar and planar LEDMOSFETs. That is, in both the LEDMOSFET embodiment 800.1 and 800.2, a specific Vb over 10-15 volts (e.g., between 15-50 volts) can be achieved.

It should further be noted that the process of calculating the optimal dimensions for the conductive field plates 880 and tapered depletion regions 807 is essentially the same as that used to calculate the optimal dimensions for the tapered dielectric regions and gate structure extensions, respectively, for the LEDMOSFET 100.1, 100.2, as discussed in detail above. Specifically, the following formula can be used to calculate the optimal dimensions for the conductive field plates 880 and tapered depletion regions 807. The variation of the tapered depletion thickness can be found as a function of the lateral field variation Ex. The tapered depletion region thickness tdepletion (x) is given as: tdepletion (x)=Ex ∈0 ∈depletion*x/(q Nd tsemi)+C, where Ex is the lateral electrical field, Nd is the doping level in the drift region, tsemi is the half-width of the semiconductor body and C is a constant. Such a formula describes the variation of the lateral and vertical electrical field in both the main portion of the SOI semiconductor body and the tapered depletion region.

Given the formula above, it should be understood that the dimensions of the tapered depletion regions 807 and conductive field plates 880 in either the non-planar, multi-gate, LEDMOSFET 800.1 or the planar LEDMOSFET 800.2 (like the dimensions of the tapered dielectric regions 107 and conductive field plates 180, respectively, of the LEDMOSFET 100.1, 100.2) will vary depending upon the various specifications for the drain drift region 840 and the desired Vb. See FIG. 12 and the detailed discussion.

Once the design is generated at process 1004 and the dimensions of the conductive field plates 880 and tapered depletion regions 807 are defined, the LEDMOSFET 800.1, 800.2 can be formed.

Specifically, a semiconductor layer can be provided (906). This semiconductor layer can, for example, comprise a semiconductor layer of a semiconductor-on-insulator (SOI) wafer. Such an SOI wafer can comprise a semiconductor substrate (e.g., a silicon substrate or other semiconductor substrate), an insulator layer (e.g., a silicon oxide layer or other suitable insulator layer) on the substrate and a semiconductor layer (e.g., a single crystalline silicon layer, a single crystalline gallium nitride layer or other suitable semiconductor layer) on the insulator layer. Alternatively, the semiconductor layer can comprise the upper portion of a bulk semiconductor wafer (e.g., a single crystalline silicon wafer) or any other suitable wafer (e.g., a hybrid orientation (HOT) wafer) (not shown).

Next, an isolation region 805 can be formed in the semiconductor layer (1008, see FIG. 32). Specifically, a trench isolation structure 805 can be formed such that it extends vertically through the semiconductor layer (e.g., to the insulator layer, in the case of an SOI wafer) in order to define the shape of the semiconductor body 804, according to the design, including the rectangular shaped main portion 804a and the additional portions 804b that extend laterally from the opposing sides 891-982 of the main portion 804a. The trench isolation structure 805 can be formed, for example, using conventional shallow trench isolation (STI) formation techniques. That is, a trench can be formed (e.g., using lithographic patterning techniques) and, then, filled with one or more isolation materials (e.g., a silicon oxide, silicon nitride, silicon oxynitride, etc.).

Figure 34:
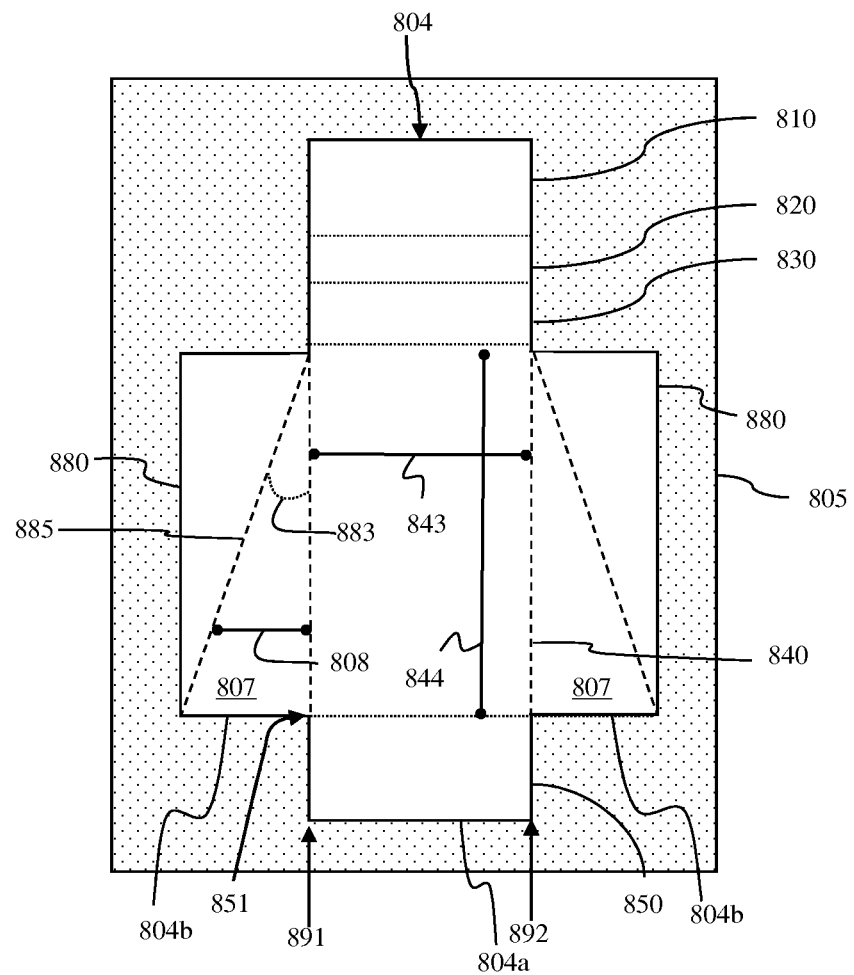
FIG. 34 is a cross-section diagram of a partially completed LEDMOSFET formed according to the method of FIG. 32.

Then, a plurality of dopant implant regions can be formed within the semiconductor body 804 (1009, see FIG. 34). Specifically, multiple masked dopant implant processes can be performed so as to form the following, in the main portion 804a of the semiconductor body: (1) a channel region 830 doped with a relatively low concentration of a first conductivity type dopant so as to have a first conductivity type; (2) source and drain regions 810, 850 on opposite sides of the channel region 830 and doped with a relatively high concentration of a second conductivity type dopant so as to have a second conductivity type; (3) an optional halo region 820 positioned laterally between the source region 810 and the channel region 830 and having the same conductivity type as the channel region 830, but doped at a higher concentration so as to reduce short channel effects; and (4) a drain drift region 840 positioned laterally between the channel region 830 and the drain region 850 and having the same conductivity type as the drain region 810, but doped at a lesser concentration. The drain drift region 840 should be aligned between the additional portions 804b of the semiconductor body and should have approximately the same length 844 as those additional portions 804b.

The multiple masked dopant implant processes can further be performed so as to form the following, in each of the additional portions 804b of the semiconductor body: a conductive field plate 880 and a tapered depletion region 807. Specifically, the dopant implant processes can be performed so that each conductive field plate 880 has a sidewall 885, also referred to herein as in implant region edge (e.g., a linear sidewall or linear implant region edge) that extends laterally from adjacent the channel region 830 to adjacent the drain region 850 without extending past the junction 851 between the drain drift region 840 and the drain region 850 and further that is angled relative to drain drift region 840. Thus, the remaining area of the additional portion 804b between the conductive field plate 880 and drain drift region 840 will have a continuously increasing width 808 (e.g., a linearly increasing width) along the length 844 of the drain drift region 840 from adjacent the channel region 830 to adjacent the drain region 850. That is, the area between the conductive field plate 880 and the drain drift region 840 will be tapered from adjacent the drain region 850 to adjacent the channel region 830. This area can be either undoped or low-doped (e.g., having the same conductivity type and dopant concentration level as the channel region 830) such that it can function as a tapered depletion region 807. Those skilled in the art will recognize oftentimes the semiconductor layer of an SOI wafer or the semiconductor material of a bulk semiconductor wafer may initially be doped with a low concentration of a first conductivity type dopant (e.g., may have P− doping). In this case, dopant implantation into regions (e.g., the channel region 830 or tapered depletion regions 807) requiring such doping would be unnecessary.

A gate structure 870 can further be formed adjacent to the channel region 830 (1010 or 1012).

For a non-planar, multi-gate, LEDMOSFET 800.1, a gate structure 870 can be formed adjacent to the channel region 830 such that it horizontal section 871 positioned on the top surface 893 of the semiconductor body 804 and vertical sections 872 positioned on the first and second sides 891, 892 of the semiconductor body 804 (1010, see FIG. 28). To form such a gate structure 870 at process 1010 essentially symmetric trenches can be formed through the trench isolation region on the opposing sides and of the semiconductor body adjacent to the channel region (e.g., using conventional lithographic patterning and etch techniques). Next, a conformal gate dielectric layer (e.g., a gate oxide layer, a high-k gate dielectric layer or other suitable gate dielectric layer) can be formed (e.g., deposited) so as to line the trenches and cover the top surface of the semiconductor body. After the gate dielectric layer is formed, a gate conductor layer (e.g., a metal gate conductor layer, a polysilicon gate conductor layer, a dual work function gate conductor layer or other suitable gate conductor layer) can be formed on the gate dielectric layer. The gate dielectric-gate conductor gate stack can then be lithographically patterned and etched to form the gate structure 870.

For a planar LEDMOSFET 800.2, a gate structure 870 can be formed adjacent to the channel region 830 on the top surface 893 only of the semiconductor body 804 (1012, see FIG. 29). To form such a gate structure 870 at process 1012, a gate dielectric layer (e.g., a gate oxide layer, a high-k gate dielectric layer or other suitable gate dielectric layer) can be formed (e.g., deposited) so as to cover the semiconductor body and the isolation region. After the gate dielectric layer is formed, a gate conductor layer (e.g., a metal gate conductor layer, a polysilicon gate conductor layer, a dual work function gate conductor layer or other suitable gate conductor layer) can be formed on the gate dielectric layer. The gate dielectric-gate conductor gate stack can then be lithographically patterned and etched to form the gate structure 870.

The above-described techniques for forming the gate structure 870 for a non-planar multi-gate LEDMOSFET 800.1 at process 1010 or for a planar LEDMOSFET 800.2 at process 1012 are offered for illustration purposes. It should be understood that any other suitable techniques or materials for forming a gate structure 870 could alternatively be used. Additionally, as illustrated in the flow diagram of FIG. 32, the process 1010 or 1012 of forming the gate structure 870 may be performed after the formation of the plurality of dopant implant regions at process 1009. However, it should be understood that, alternatively, the process 1010 or 1012 of forming the gate structure 870 may be performed prior to forming any one or more of the dopant implant regions at process 1009.

Referring again to the flow diagram of FIG. 32, additional processing steps can then be performed in order to complete the LEDMOSFET 800.1, 800.2, as appropriate (1014). These additional steps can include, but are not limited to, the following: silicide formation; interlayer dielectric deposition; contact formation, etc. Such additional process steps are well known in the art. Thus, the details of these process steps are omitted from this specification in order to allow the reader to focus on the salient aspects of the disclosed embodiments.

Those skilled in the art will recognize that similar method steps to those described above and illustrated in FIG. 32 for designing and forming the LEDMOSFET 800.1 can also be used to form an LEDMOSFET having multiple semiconductor fingers (i.e., semiconductor fins) for increased channel width and, thereby drive current. In this case, each semiconductor fin would comprise a drain drift region flanked by tapered depletion regions and discrete conductive field plates.

Also disclosed herein are embodiments of program storage devices (i.e., computer program products) associated with each of the above-described method embodiments and, particularly, with process steps 904 of FIG. 31 and 1004 of FIG. 32. Such program storage devices can be readable by a computer and can tangibly embody a program of instructions executable by that computer to perform a method of designing any of the LEDMOSFETs, as described in detail above. Furthermore, it should be understood that a representative hardware environment for practicing the disclosed method embodiments and, particularly, process steps 904 of FIG. 31 and 1004 of FIG. 32 is depicted in FIG. 19, as described in detail above.

Also disclosed herein are embodiments of a silicon-controlled rectifier (SCR) that incorporates a complementary pair of LEDMOSFETs, each having a relatively high drain-to-body breakdown voltage (Vb). Specifically, each of the embodiments of the LEDMOSFET described above can be designed to achieve a specific Vb that is greater than 15 volts. Thus, these LEDMOSFETs are ideal for incorporation into switch applications, which require a Vb of greater than 20 volts or, micro-electronic mechanical (MEMS) applications, which require a Vb of 30-50 volts may be required. Such LEDMOSFETs can also be incorporated into a silicon-controlled rectifier (SCR) for use in devices in which the control of high power, coupled with high voltage (e.g., above 15 volts) is required.

Figure 35:
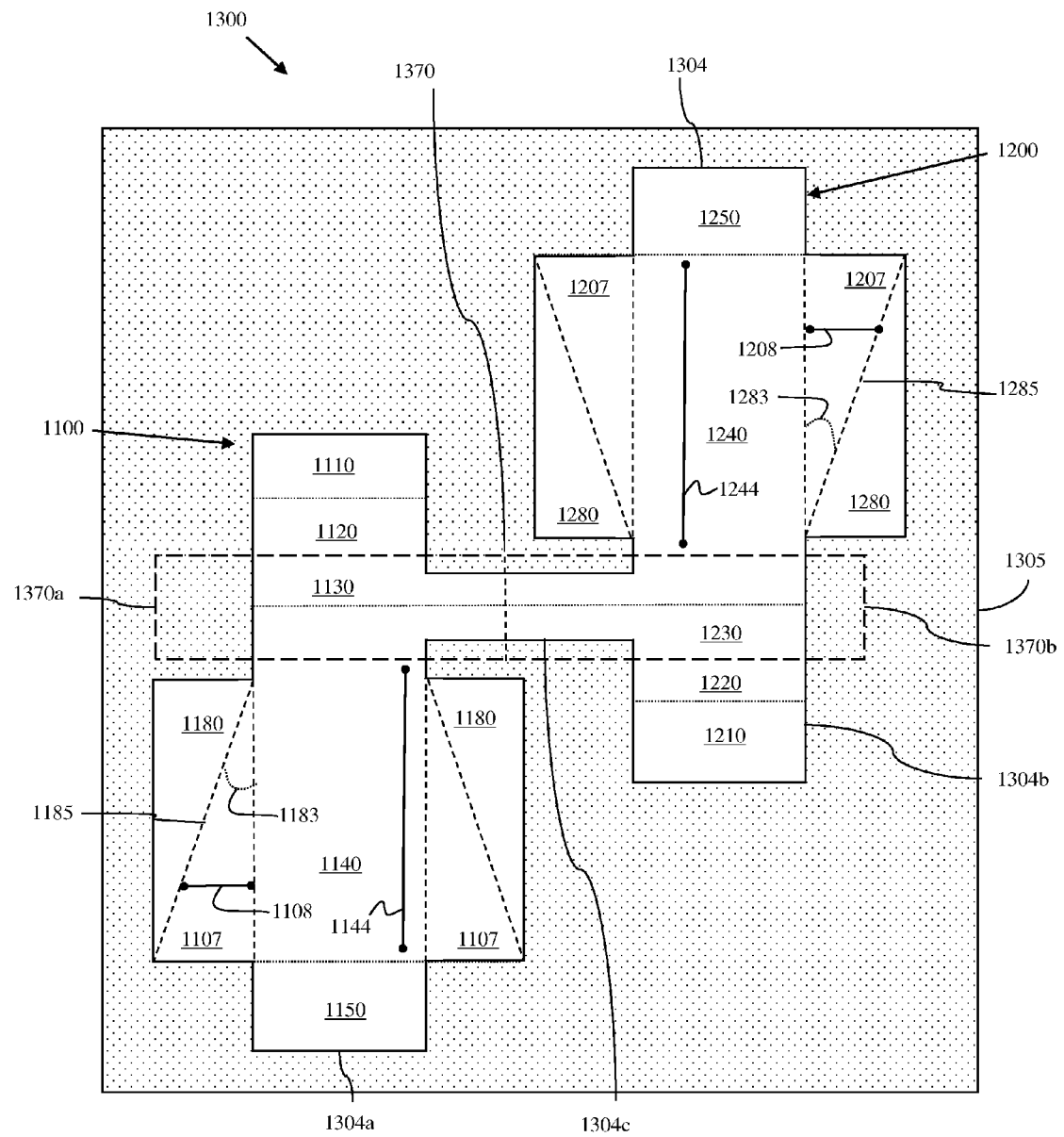
FIG. 35 is a top view illustration of embodiments of a silicon-controlled rectifier (SCR) incorporating a pair of complementary LEDMOSFETs.

For example, as shown in FIG. 35, a silicon-controlled rectifier (SCR) 1300 can comprise a semiconductor body 1304 defined by a trench isolation region 1305, a first LEDMOSFET 1100 and a second LEDMOSFET 1200 having a different conductivity type than the first LEDMOSFET. For example, the LEDMOSFET 1100 can comprise a P-type LEDMOSFET and the LEDMOSFET 1200 can comprise an N-type LEDMOSFET. In other words, the SCR 1300 can comprise a complementary pair of LEDMOSFETs. Each of these LEDMOSFETs 1100, 1200 can further be configured so as to have a relatively high drain-to-body breakdown voltage (Vb).

Specifically, the first LEDMOSFET 1100 can comprise, in the semiconductor body 304, a first source region 1110, a first source-side halo region 1120 positioned laterally adjacent to the first source region 1110, a first channel region 1130 positioned laterally adjacent to the first source-side halo region 1120, a first drain region 1150 and a first drain drift region 1140 between the first channel region 1130 and the first drain region 1150. The first LEDMOSFET 100 can also comprise first conductive field plates 1180 adjacent to first opposing sides of the first drain drift region 1140 with each first conductive field plate 1180 having a first sidewall 1185 angled (see angle 1183) relative to the first drain drift region 1140 such that a first area 1107 between the first drain drift region 1140 and the first conductive field plate 1180 has a continuously increasing first width 1108 along a first length 1144 of the first drain drift region 1140 from adjacent the first channel region 1130 to adjacent the first drain region 1150.

The second LEDMOSFET 1200 can comprise, in the semiconductor body 1304, a second source region 1210, a second source-side halo region 1220 positioned laterally adjacent to the second source region 1210, a second channel region 1230 positioned laterally adjacent to the second source-side halo region 1220, a second drain region 1250 and a second drain drift region 1240 between the second channel region 1230 and the second drain region 1250. The second LEDMOSFET 1200 can also comprise second conductive field plates 1280 adjacent to second opposing sides of the second drain drift region 1240 with each second conductive field plate 1280 having a second sidewall 1285 angled (see angle 1283) relative to the second drain drift region 1240 such that a second area 1207 between the second drain drift region 1240 and the second conductive field plate 1280 has a continuously increasing second width 1208 along a second length 1244 of the second drain drift region 1240 from adjacent the second channel region to adjacent the second drain region 1250.

As shown and similar to the LEDMOSFET 800.2 discussed in detail above, the first and second conductive field plates 1180, 1280 of the first and second LEDMOSFETs 1100, 1200 can comprise dopant implant regions within the same semiconductor body 1304 as the first and second drain drift regions 1140, 1150, respectively. It should be noted that since the LEDMOSFETs have different conductivity types, the first and second conductive field plates 1180, 1280 formed as dopant implant regions will also have different conductivity types. For example, a P-type LEDMOSFET 1100 can have N+ dopant implant regions for conductive field plates 1180 and N-type LEDMOSFET 1200 can have P+ dopant implant regions for conductive field plates 1280. In this case, the first and second areas 1107, 1207 between the first and second conductive field plates 1180, 1280 and the first and second drain drift regions 1140, 1240 can comprise first and second tapered depletion regions with that same semiconductor body 1304.

Alternatively and similar to the LEDMOSFET 700.2 discussed in detail above, the first and second conductive field plates 1180, 1280 of the first and second LEDMOSFETs 1100, 1200 can comprise discrete polysilicon or metal structures. In this case, the first and second areas 1107, 1207 between the first and second conductive field plates 1180, 1280 and the first and second drain drift regions 1140, 1240 can comprise first and second tapered dielectric regions (i.e., portions of the trench isolation region 1305).

Additionally, in the SCR 1300, the LEDMOSFETs 1100 and 1200 can be interconnected at the channel regions 1130 and 1230 (i.e., the first channel region 1130 abuts the second channel region 1230) and can share a single gate structure 1370 (i.e., a single gate structure 1370 can be positioned adjacent to (i.e., can traverse) both of the channel regions 1130, 1230. Specifically, as shown in FIG. 35, the semiconductor body 1304 can comprise a first section 1304a, a second section 1304b and a connecting section 1304c. The primary components (e.g., 1110, 1120, 1130, 1140, 1150 and, if applicable, 1180 and 1107) of the first LEDMOSFET 1100 can be formed in the first section 1304a in a first order (e.g., first source region 1110, first source-side halo region 1120, etc.) and the primary components (e.g., 1210, 1220, 1230, 1240, 1250 and, if applicable, 1280 and 1207) of the second LEDMOSFET 1200 are formed in the second section 1304b in a second order that is the opposite of the first order (e.g., first drain region 1250, first drain drift region 1240, etc.) Additionally, the first and second sections 1304a and 1304b can be offset such that the channel regions 1130 and 1230 are laterally aligned. Finally, the connecting section 1304c can provide a link between the channel regions 1130, 1230.

The shared gate structure 1370 can be positioned adjacent to (i.e., can traverse) the first channel region 1130 of the first LEDMOSFET 1100, the connecting section 1304c and the second channel region 1230 of the second LEDMOSFET 1100. This shared gate structure 1370 can comprise a dual-work function gate structure. That is, it can comprise a first portion 1370a with a first work function adjacent to the first channel region 1130 and a second portion 1370b with a second work function different from the first work function adjacent to the second channel region 1230.

Specifically, those skilled in the art will recognize that a gate structure typically includes gate dielectric layer and a gate conductor layer stacked on the gate dielectric layer. The gate conductor material will vary to achieve a particular work function depending upon whether the field effect transistor is a P-type field effect transistor or an N-type field effect transistor. For example, a conventional gate stack structure can comprise a thin silicon oxide ($SiO_2$) gate dielectric layer and a polysilicon gate conductor layer appropriately doped to achieve a desired work function (i.e., to set the gate Fermi level at the appropriate band for an P-type or N-type field effect transistor). For a P-type field effect transistor, P-type doping of the polysilicon gate conductor layer can be employed to set the gate Fermi levels at the valence band; whereas, for an N-type field effect transistor, N-type doping of the polysilicon gate conductor layer can be employed to set the gate Fermi levels at the conduction band. Alternatively, a gate stack structure can comprise a high-k gate dielectric layer and a metal gate conductor layer. In this case, a different metal material can be used to achieve the desired work function (i.e., to set the gate Fermi level at the appropriate band for a P-type or N-type field effect transistor). Since the SCR 1300 comprises a single gate structure 1370, which traverses the channel regions of both a P-type field effect transistor 1100 and an N-type field effect transistor 1200, that gate structure 1370 can preferably comprise a first portion 1370a having a first work function, adjacent to the first channel region 1130 and a second portion 1370b having a second work function different from the first work function adjacent to the second channel region 1230.

Those skilled in the art will recognize that similar method steps to those described in detail above for designing and forming the various LEDMOSFETs individually can also be used to form such an SCR 1300 incorporating a complementary pair of any two of the LEDMOSFETs.

The descriptions of the various embodiments above have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are embodiments of a lateral, extended drain, metal oxide semiconductor, field effect transistor (LEDMOSFET) having a high drain-to-body breakdown voltage (Vb). In the embodiments, discrete conductive field plates are positioned adjacent to opposing sides of the drain drift region. Each conductive field plant has an angled sidewall such that the area between the drain drift region and the conductive field plate has a continuously increasing width along the length of the drain drift region from the channel region to the drain region. The conductive field plates can comprise polysilicon or metal structures or dopant implant regions within the same semiconductor body as the drain drift region. The areas between the conductive field plates and the drain drift region can comprise tapered dielectric regions or, alternatively, tapered depletion regions within the same semiconductor body as the drain drift region. The dimensions of the tapered dielectric or depletions regions and, thereby the dimensions of the conductive field plates can be predefined based on the dimensions of the drain drift region in order to achieve a specific relatively high drain-to-body breakdown voltage (Vb) suitable for switch, micro-electronic mechanical (MEMS) or silicon-controlled rectifier (SCR) applications. Also disclosed are embodiments of a method for forming such LEDMOSFETs and embodiments of a silicon-controlled rectifier (SCR) incorporating a complementary pair of such LEDMOSFETs.

What is claimed is:

1. A field effect transistor comprising:
   a semiconductor body having opposing sides and opposing ends, said opposing ends comprising a first end and a second end opposite said first end and said semiconductor body comprising:
      a source region at said first end;
      a channel region positioned laterally adjacent to said source region;
      a drain region at said second end; and
      a drain drift region positioned laterally between said channel region and said drain region;
   a trench isolation region positioned laterally immediately adjacent to at least said opposing ends and said opposing sides at said source region and said drain region; and,
   conductive field plates adjacent to said opposing sides at said drain drift region and extending laterally along a length of said drain drift region only from adjacent said channel region to an interface between said drain drift region and said drain region, each conductive field plate of said conductive field plates having a sidewall angled relative to said drain drift region such that areas between said drain drift region and said conductive field plates each have a continuously increasing width along said length of said drain drift region.

2. The field effect transistor of claim 1, said conductive field plates comprising any one of the following:
   discrete polysilicon structures;
   discrete metal structures; and
   doped regions of said semiconductor body.

3. The field effect transistor of claim 2, said doped regions having a different conductivity type than said drain region.

4. The field effect transistor of claim 1, said semiconductor body being rectangular in shape and said isolation region further comprising portions positioned laterally immediately adjacent to said opposing sides at said drain drift region so as to fill said areas.

5. The field effect transistor of claim 1, said sidewall being essentially linear such that said areas each have a linearly increasing width.

6. The field effect transistor of claim 1, said areas each having predefined dimensions to ensure that said drain drift region has an essentially uniform horizontal electric field profile from said channel region to said drain region.

7. The field effect transistor of claim 1, said areas each having predefined dimensions to ensure that said field effect transistor has a specific drain-to-body breakdown voltage.

8. A silicon-controlled rectifier comprising:
   a semiconductor body;
   a first field effect transistor comprising:
      a first channel region in said semiconductor body;
      a first drain region in said semiconductor body;
      a first drain drift region in said semiconductor body between said first channel region and said first drain region; and
      first conductive field plates adjacent to first opposing sides of said first drain drift region, each first conductive field plate of said first conductive field plates having a first sidewall angled relative to said first drain drift region such that first areas between said first drain drift region and said first conductive field plates each have a continuously increasing first width along a first length of said first drain drift region from adjacent said first channel region to adjacent said first drain region; and
   a second field effect transistor having a different type conductivity than said first field effect transistor, said second field effect transistor comprising:
      a second channel region in said semiconductor body abutting said first channel region;
      a second drain region in said semiconductor body;
      a second drain drift region in said semiconductor body between said second channel region and said second drain region; and
      second conductive field plates adjacent to second opposing sides of said second drain drift region, each second conductive field plate of said second conductive field plates having a second sidewall angled relative to said second drain drift region such that second areas between said second drain drift region and said second conductive field plates each have a continuously increasing second width along a second length of said second drain drift region from adjacent said second channel region to adjacent said second drain region.

9. The silicon-controlled rectifier of claim 8, further comprising a gate structure adjacent to both said first channel region and said second channel region.

10. The silicon-controlled rectifier of claim 9, said gate structure comprising a dual work function gate structure.

11. The silicon-controlled rectifier of claim 8, said first conductive field plates and said second conductive plates each comprising any of the following:
   discrete polysilicon structures;
   discrete metal structures; and
   dopant implant regions in said semiconductor body.

12. The silicon controlled rectifier of claim 8, said first areas and said second areas each comprising any one of the following:
   a portion of a trench isolation region; and
   a depletion region of said semiconductor body.

13. The silicon-controlled rectifier of claim 8, said first sidewall and said second sidewall each being essentially linear such that said first areas and said second areas each have a linearly increasing width.

14. A field effect transistor comprising:
   a semiconductor body comprising:
      a main portion having opposing sides and opposing ends, said opposing ends comprising a first end and a second end opposite said first end and said main portion comprising:
         a source region at said first end;
         a channel region positioned laterally adjacent to said source;
         a drain region at said second end; and,
         a drain drift region positioned laterally between said channel region and said drain region; and,
      additional portions extending laterally from said opposing sides of said main portion at and along a length of said drain drift region only, said main portion and said additional portions each being essentially rectangular in shape such that said semiconductor body is essentially cross-shaped and each additional portion comprising:
         a conductive field plate comprising a dopant implant region; and,
         a tapered depletion region positioned laterally between said drain drift region and said conductive field plate, said dopant implant region having an implant region edge that is angled relative to said drain drift region such that said tapered depletion region between said drain drift region and said conductive field plate has a continuously increasing width along said length of said drain drift region from adjacent said channel region to an interface between said drain drift region and said drain region.

15. The field effect transistor of claim 14, further comprising a trench isolation region position laterally around and defining a shape of said semiconductor body.

16. The field effect transistor of claim 14, said tapered depletion region being undoped.

17. The field effect transistor of claim 14, said tapered depletion region being doped so as to have a same type conductivity at a lower conductivity level than said dopant implant region.

18. The field effect transistor of claim 14, said implant region edge being essentially linear such that said tapered depletion region has a linearly increasing width.

19. The field effect transistor of claim 14, said tapered depletion region having predefined dimensions to ensure that said drain drift region has an essentially uniform horizontal electric field profile from said channel region to said drain region.

20. The field effect transistor of claim 14, said tapered depletion region having predefined dimensions to ensure that said field effect transistor has a specific drain-to-body breakdown voltage.

* * * * *